(12) United States Patent
Oliver et al.

(10) Patent No.: US 7,429,494 B2
(45) Date of Patent: Sep. 30, 2008

(54) MICROELECTRONIC IMAGERS WITH OPTICAL DEVICES HAVING INTEGRAL REFERENCE FEATURES AND METHODS FOR MANUFACTURING SUCH MICROELECTRONIC IMAGERS

(75) Inventors: Steven D. Oliver, Santa Rosa, CA (US); James M. Wark, Boise, ID (US); Kyle K. Kirby, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 656 days.

(21) Appl. No.: 10/925,406

(22) Filed: Aug. 24, 2004

(65) Prior Publication Data

US 2006/0043512 A1    Mar. 2, 2006

(51) Int. Cl.
*H01L 21/00* (2006.01)

(52) U.S. Cl. .............................. 438/26; 438/27; 438/29

(58) Field of Classification Search ........... 257/88–103, 257/431–448; 438/22–29
See application file for complete search history.

(56) References Cited

U.S. PATENT DOCUMENTS

| | | |
|---|---|---|
| 3,345,134 A | 10/1967 | Heymer et al. |
| 4,534,100 A | 8/1985 | Lane |
| 4,906,314 A | 3/1990 | Farnworth et al. |
| 5,130,783 A | 7/1992 | McLellan |
| 5,371,397 A | 12/1994 | Maegawa et al. |
| 5,424,573 A | 6/1995 | Kato et al. |
| 5,435,887 A | 7/1995 | Rothschild et al. |
| 5,505,804 A | 4/1996 | Mizuguchi et al. |
| 5,593,913 A | 1/1997 | Aoki |
| 5,605,783 A | 2/1997 | Revelli et al. |
| 5,672,519 A | 9/1997 | Song et al. |
| 5,694,246 A | 12/1997 | Aoyama et al. |
| 5,708,293 A | 1/1998 | Ochi et al. |
| 5,771,158 A | 6/1998 | Yamagishi et al. |
| 5,776,824 A | 7/1998 | Farnworth et al. |
| 5,811,799 A | 9/1998 | Wu |

(Continued)

FOREIGN PATENT DOCUMENTS

EP    0 886 323    12/1998

(Continued)

OTHER PUBLICATIONS

U.S. Appl. No. 10/785,466, Kirby.

(Continued)

*Primary Examiner*—Cuong Q Nguyen
(74) *Attorney, Agent, or Firm*—Dickstein Shapiro LLP

(57) ABSTRACT

Microelectronic imager assemblies with optical devices having integral reference features and methods for assembling such microelectronic imagers is disclosed herein. In one embodiment, the imager assembly can include a workpiece with a substrate having a front side, a back side, and a plurality of imaging dies on and/or in the substrate. The imaging dies include image sensors, integrated circuitry operatively coupled to the image sensors, and external contacts electrically coupled to the integrated circuitry. The assembly also includes optics supports on the workpiece. The optics supports have openings aligned with corresponding image sensors and first interface features at reference locations relative to corresponding image sensors. The assembly further includes optical devices having optics elements and second interface features seated with corresponding first interface features to position the optics elements at a desired location relative to corresponding image sensors.

44 Claims, 19 Drawing Sheets

U.S. PATENT DOCUMENTS

| | | | |
|---|---|---|---|
| 5,821,532 A | 10/1998 | Beaman et al. |
| 5,857,963 A | 1/1999 | Pelchy et al. |
| 5,861,654 A | 1/1999 | Johnson |
| 5,877,040 A | 3/1999 | Park et al. |
| 5,897,338 A | 4/1999 | Kaldenberg |
| 5,914,488 A | 6/1999 | Sone |
| 5,977,535 A | 11/1999 | Rostoker |
| 5,998,862 A | 12/1999 | Yamanaka |
| 6,080,291 A | 6/2000 | Woodruff et al. |
| 6,104,086 A | 8/2000 | Ichikawa et al. |
| 6,114,240 A | 9/2000 | Akram et al. |
| 6,143,588 A | 11/2000 | Glenn |
| 6,236,046 B1 | 5/2001 | Watabe et al. |
| 6,259,083 B1 | 7/2001 | Kimura |
| 6,266,197 B1 | 7/2001 | Glenn et al. |
| 6,274,927 B1 | 8/2001 | Glenn |
| 6,285,064 B1 | 9/2001 | Foster |
| 6,351,027 B1 | 2/2002 | Giboney et al. |
| 6,372,548 B2 | 4/2002 | Bessho et al. |
| 6,407,381 B1 | 6/2002 | Glenn et al. |
| 6,411,439 B2 | 6/2002 | Nishikawa |
| 6,483,652 B2 | 11/2002 | Nakamura |
| 6,503,780 B1 | 1/2003 | Glenn et al. |
| 6,541,762 B2 | 4/2003 | Knag et al. |
| 6,560,047 B2 | 5/2003 | Choi et al. |
| 6,566,745 B1 | 5/2003 | Beyne et al. |
| 6,603,183 B1 | 8/2003 | Hoffman |
| 6,617,623 B2 | 9/2003 | Rhodes |
| 6,661,047 B2 | 12/2003 | Rhodes |
| 6,667,551 B2 | 12/2003 | Hanaoka et al. |
| 6,670,986 B1 | 12/2003 | Ben Shoshan et al. |
| 6,686,588 B1 | 2/2004 | Webster et al. |
| 6,703,310 B2 | 3/2004 | Mashino et al. |
| 6,864,172 B2 | 4/2004 | Noma et al. |
| 6,734,419 B1 | 5/2004 | Glenn et al. |
| 6,759,266 B1 | 7/2004 | Hoffman |
| 6,774,486 B2 | 8/2004 | Kinsman |
| 6,778,046 B2 | 8/2004 | Stafford et al. |
| 6,791,076 B2 | 9/2004 | Webster |
| 6,795,120 B2 | 9/2004 | Takagi et al. |
| 6,797,616 B2 | 9/2004 | Kinsman |
| 6,800,943 B2 | 10/2004 | Adachi |
| 6,813,154 B2 | 11/2004 | Diaz et al. |
| 6,825,458 B1 | 11/2004 | Moess et al. |
| 6,828,663 B2 | 12/2004 | Chen et al. |
| 6,828,674 B2 | 12/2004 | Karpman |
| 6,844,978 B2 | 1/2005 | Harden et al. |
| 6,882,021 B2 | 4/2005 | Boon et al. |
| 6,885,107 B2 | 4/2005 | Kinsman |
| 6,934,065 B2 | 8/2005 | Kinsman |
| 6,946,325 B2 | 9/2005 | Yean et al. |
| 7,189,954 B2 * | 3/2007 | Farnworth et al. | 257/432 |
| 2002/0006687 A1 | 1/2002 | Lam |
| 2002/0057468 A1 | 5/2002 | Segawa et al. |
| 2002/0089025 A1 | 7/2002 | Chou |
| 2002/0096729 A1 | 7/2002 | Tu et al. |
| 2002/0113296 A1 | 8/2002 | Cho et al. |
| 2002/0145676 A1 | 10/2002 | Kuno et al. |
| 2003/0062601 A1 | 4/2003 | Harnden et al. |
| 2004/0012698 A1 | 1/2004 | Suda et al. |
| 2004/0023469 A1 | 2/2004 | Suda |
| 2004/0038442 A1 | 2/2004 | Kinsman |
| 2004/0041261 A1 | 3/2004 | Kinsman |
| 2004/0082094 A1 | 4/2004 | Yamamoto |
| 2004/0214373 A1 | 10/2004 | Jing et al. |
| 2004/0245649 A1 | 12/2004 | Imaoka |
| 2005/0052751 A1 | 3/2005 | Liu et al. |
| 2005/0104228 A1 | 5/2005 | Rigg et al. |
| 2005/0110889 A1 | 5/2005 | Tuttle et al. |
| 2005/0127478 A1 | 6/2005 | Hiatt et al. |
| 2005/0151228 A1 | 7/2005 | Tanida et al. |
| 2005/0236708 A1 | 10/2005 | Farnworth et al. |
| 2005/0254133 A1 | 11/2005 | Akram et al. |

FOREIGN PATENT DOCUMENTS

| | | |
|---|---|---|
| EP | 1 157 967 A2 | 11/2001 |
| FR | 2 835 654 A1 | 8/2003 |
| JP | 59-101882 A | 6/1984 |
| JP | 59-191388 | 10/1984 |
| JP | 07-263607 A | 10/1995 |
| JP | 2001-077496 A | 3/2001 |
| WO | WO-90/05424 A1 | 5/1990 |
| WO | WO-02/075815 A1 | 9/2002 |
| WO | WO-02/095796 A2 | 11/2002 |
| WO | WO-2004/054001 A2 | 6/2004 |

OTHER PUBLICATIONS

U.S. Appl. No. 10/845,304, Jiang et al.
U.S. Appl. No. 10/857,948, Boettiger et al.
U.S. Appl. No. 10/863,994, Akram et al.
U.S. Appl. No. 10/864,974, Kirby et al.
U.S. Appl. No. 10/867,352, Farnworth et al.
U.S. Appl. No. 10,867,505, Farnworth et al.
U.S. Appl. No. 10/879,398, Akram et al.
U.S. Appl. No. 10/879,838, Kirby et al.
U.S. Appl. No. 10/893,022, Hall et al.
U.S. Appl. No. 10/894,262, Farnworth et al.
U.S. Appl. No. 10/901,851, Derderian et al.
U.S. Appl. No. 10/910,491, Bolken et al.
U.S. Appl. No. 10/915,180, Street et al.
U.S. Appl. No. 10/919,605, Farnworth et al.
U.S. Appl. No. 10/922,177, Oliver et al.
U.S. Appl. No. 10/922,192, Farnworth
U.S. Appl. No. 10/925,501, Oliver
U.S. Appl. No. 10/925,502, Watkins et al.
U.S. Appl. No. 10/927,550, Derderian et al.
U.S. Appl. No. 10/926,760, Chong et al.
U.S. Appl. No. 10/928,598, Kirby.
U.S. Appl. No. 10/932,296, Oliver et al.
U.S. Appl. No. 11/027,443, Kirby.
U.S. Appl. No. 11/054,692, Boemler
U.S. Appl. No. 11/056,211, Hembree et al.
U.S. Appl. No. 11/056,484, Boettiger et al.
U.S. Appl. No. 11/061,034, Boettiger
U.S. Appl. No. 11/146,783, Tuttle et al.
U.S. Appl. No. 11/169,546, Sulfridge.
U.S. Appl. No. 11/169,838, Sulfridge.
U.S. Appl. No. 11/177,905, Akram.
U.S. Appl. No. 11/209,524, Akram.
U.S. Appl. No. 11/217,169, Hiatt et al.
U.S. Appl. No. 11/217,877, Oliver et al.
U.S. Appl. No. 11/218,126, Farnworth et al.
U.S. Appl. No. 11/218,243, Kirby et al.
Aachboun, S. and P. Ranson, "Cryogenic etching of deep narrow trenches in silicon," J. Vac. Sci. Technol. A 18(4), Jul./Aug. 2000, pp. 1848-1852.
Aachboun, S. and P. Ranson, "Deep anisotropic etching of silicon," J. Vac. Sci. Technol. A 17(4), Jul./Aug. 1999, pp. 2270-2273.
Austin, M.D. and S.Y. Chou, "Fabrication of 70 nm channel length polymer organic thin-film transistors using nanoimprint lithography," Applied Physics Letters, vol. 81, No. 23, pp. 4431-4433, Dec. 2, 2002, American Institute of Physics.
Blackburn, J.M. et al., "Deposition of Conformal Copper and Nickel Films from Supercritical Carbon Dioxide," Science, vol. 294, pp. 141-145, Oct. 5, 2001.
Brubaker, C. et al., "Ultra-thick Lithography for Advanced Packaging and MEMS," SPIE's 27th Annual International Symposium on Microlithography 2002, Mar. 3-8, 2002, Santa Clara, CA.
Cheng, Yu-T. et al., "Vacuum Packaging Technology Using Localized Aluminum/Silicon-to-Glass Bonding," Journal of Microelectromechanical Systems, vol. 11, No. 5, pp. 556-565, Oct. 2002.

DuPont Electronic Materials, Data Sheet, Pyralux PC 2000 Flexible Composites, 4 pages, Oct. 1998, <http://www.dupont.com/fcm>.

Edmund Industrial Optics, Mounted IR Filters, 1page, retrieved from the Internet on Jun. 30, 2003, <http://www.edmundoptics.com>.

Hamdorf, M. et al., "Surface-rheological measurements on glass forming polymers based on the surface tension driven decay of imprinted corrugation gratings," Journal of Chemical Physics, vol. 112, No. 9, pp. 4262-4270, Mar. 1, 2000, American Instiutute of Physics.

Hirafune, S. et al., "Packaging Technology for Imager Using Through-hole Interconnection in Si Substrate," Proceeding of HPD'04, IEEE, pp. 303-306, Jul. 2004

IBM, Zurich Research Laboratory, EPON SU-8 photoresist, 1 page, retrieved from the Internet on Jan. 21, 2003, <http://www.zurich.ibm.com/st/mems/su8.html>.

Intrinsic Viscosity and Its Relation to Intrinsic Conductivity, 9 pages, retrieved from the Internet on Oct. 30, 2003, <http://www.ciks.cbt.nist.gov/~garbocz/paper58/node3.html>.

King, B. et al., Optomec,Inc., M3D™ Technology, Maskless Mesoscale™ Materials Deposition, 5 pages, <http://www.optomec.com/downloads/M3D%20White%Paper%20080502.pdf>, retrieved from the Internet on Jun. 17, 2005.

Kingpak Technology, Inc. "CMOS Image Sensor Packaging," 1 page, retrieved from the Internet on Aug. 26, 2003, <http://www.kingpak.com/CMOSImager.html>.

Kramer, S.J. et al., "Annual Report—Applications of Supercritical Fluid Technology to Semiconductor Device Processing," pp. 1-29, Nov. 2001.

Kyocera Corporation, Memory Package, 1 page, retrieved from the Internet on Dec. 3, 2004, <http://global.kyocera.com/prdct/semicon/ic_pkg/memory_p.html>.

Lin, Tim (Zhigang) and Rick Yoon, "One Package Technique of Exposed MEMS Sensors," pp. 105-108, 2002 International Symposium on Microelectronics, Sep. 2002.

Ma, X. et al., "Low Temperature Bonding for Wafer Scale Packaging and Assembly of Micromachined Sensors," Final Report 1998-1999 for Micro Project 98-144, 3 pages, Department of Electrical & Computer Engineering, University of California, Davis.

Micro Chem, Nano SU-8, Negative Tone Photoresist Formulations 50-100, 4 pages, Feb. 2002, <http://www.microchem.com/products/pdf/SU8_50-100.pdf>.

Optomec, Inc., M3D™ Technology, Maskless Mesoscale Materials Deposition (M3D), 1 page, <http://www.optomec.com/html/m3d.htm>, retrieved from the Internet on Aug. 15, 2003.

Optomec, Inc., M3D™, Maskless Mesoscale™ Materials Deposition, 2 pages, <http://www.optomec.com/downloads/M3DSheet.pdf>, retrieved from the Internet on Jun. 17, 2005.

Photo Vision Systems, Inc., "Advances in Digital Image Sensors," 22 pages, First Annual New York State Conference on Microelectronic Design, Jan. 12, 2002.

Shen, X.-J. et al., "Microplastic embossing process: experimental and theoretical characterizations," Sensors and Actuators, A 97-98 (2002) pp. 428-433, Elsevier Science B.V.

Tapes II International Tape and Fabrication Company, Electronics and Electrical Tapes, 2 pages, 2003, <http://www.tapes2.com/electronics.htm>.

TransChip, 1 page, retrieved from the Internet on Aug. 26, 2003, <http://www.missionventures.com/portfolio/companies/transchip.html>.

TransChip, Inc., CMOS vs CCD, 3 pages, retrieved from the Internet on Dec. 14, 2005, <http://www.transchip.com/content.aspx?id=127>.

TransChip, Inc., Technology, 3 pages, retrieved from the Internet on Dec. 14, 2005, <http://www.transchip.com/content.aspx?id=10>.

UCI Integrated Nanosystems Research Facility, "Cleaning procedures for glass substrates," 3 pages, Fall 1999.

UCI Integrated Nanosystems Research Facility, "Glass Etch Wet Process," 3 pages, Summer 2000.

Walker, M.J., "Comparision of Bosch and cryogenic processes for patterning high aspect ratio features in silicon," 11 pages, Proc. SPIE vol. 4407, p. 89-99, MEMS Design, Fabrication, Characterization, and Packaging, Uwe F. Behringer; Deepak G. Uttamchandani; Eds., Apr. 2001.

Xsil, Via Applications, 1 page, <http://www.xsil.com/viaapplications/index.htm>, retrieved from the Internet on Jul. 22, 2003.

Xsil, Vias for 3D Packaging, 1 page, <http://www.xsil.com/viaapplications/3dpackaging/index.htm>, retrieved from the Internet on Jul. 22, 2003.

Ye, X.R. et al., "Immersion Deposition of Metal Films on Silicon and Germanium Substrates in Supercritical Carbon Dioxide," Chem. Mater. 2003, 15, 83-91.

Yoshida, J. "TransChip rolls out a single-chip CMOS imager," 3 pages, EE Times, Jul. 18, 2003.

* cited by examiner

MICROELECTRONIC IMAGERS WITH OPTICAL DEVICES HAVING INTEGRAL REFERENCE FEATURES AND METHODS FOR MANUFACTURING SUCH MICROELECTRONIC IMAGERS

TECHNICAL FIELD

The present invention is related to microelectronic imagers and methods for packaging microelectronic imagers. Several aspects of the present invention, more specifically, are directed toward microelectronic imagers with optical devices having integral reference features.

BACKGROUND

Microelectronic imagers are used in digital cameras, wireless devices with picture capabilities, and many other applications. Cell phones and Personal Digital Assistants (PDAs), for example, are incorporating microelectronic imagers for capturing and sending pictures. The growth rate of microelectronic imagers has been steadily increasing as they become smaller and produce better images with higher pixel counts.

Microelectronic imagers include image sensors that use Charged Coupled Device (CCD) systems, Complementary Metal-Oxide Semiconductor (CMOS) systems, or other solid state systems. CCD image sensors have been widely used in digital cameras and other applications. CMOS image sensors are also quickly becoming very popular because they are expected to have low production costs, high yields, and small sizes. CMOS image sensors can provide these advantages because they are manufactured using technology and equipment developed for fabricating semiconductor devices. CMOS image sensors, as well as CCD image sensors, are accordingly "packaged" to protect the delicate components and to provide external electrical contacts.

FIG. 1 is a schematic view of a conventional microelectronic imager 1 with a conventional package. The imager 1 includes a die 10, an interposer substrate 20 attached to the die 10, and a spacer 30 attached to the interposer substrate 20. The spacer 30 surrounds the periphery of the die 10 and has an opening 32. The imager 1 also includes a transparent cover 40 over the die 10.

The die 10 includes an image sensor 12 and a plurality of bond-pads 14 electrically coupled to the image sensor 12. The interposer substrate 20 is typically a dielectric fixture having a plurality of bond-pads 22, a plurality of ball-pads 24, and traces 26 electrically coupling bond-pads 22 to corresponding ball-pads 24. The ball-pads 24 are arranged in an array for surface mounting the imager 1 to a board or module of another device. The bond-pads 14 on the die 10 are electrically coupled to the bond-pads 22 on the interposer substrate 20 by wire-bonds 28 to provide electrical pathways between the bond-pads 14 and the ball-pads 24.

The imager 1 shown in FIG. 1 also has an optics unit including a support 50 attached to the spacer 30 and a barrel 60 adjustably attached to the support 50. The support 50 can include internal threads 52, and the barrel 60 can include external threads 62 engaged with the threads 52. The optics unit also includes a lens 70 carried by the barrel 60.

One problem with packaging conventional microelectronic imagers is that it is difficult to accurately align the lens with the image sensor. Referring to FIG. 1, the centerline of the lens 70 should be aligned with the centerline of the image sensor 12 within very tight tolerances. For example, in microelectronic imagers that have higher pixel counts and smaller sizes, the centerline of the lens 70 is often required to be within a few microns of the centerline of the image sensor 12. This is difficult to achieve with conventional imagers because the support 50 may not be positioned accurately on the spacer 30. Moreover, because the barrel 60 is threaded onto the support 50, the necessary clearance between the threads can cause misalignment between the axes of the support 50 and the barrel 60. Loss in concentricity because of non-coincident axes negatively affects the focus and/or clarity of the imager. Therefore, there is a need to align lenses with image sensors with greater precision in more sophisticated generations of microelectronic imagers.

Another problem of packaging conventional microelectronic imagers is that positioning the lens at a desired focus distance from the image sensor is time consuming and may be inaccurate. The lens 70 shown in FIG. 1 is spaced apart from the image sensor 12 at a desired distance by rotating the barrel 60 (arrow R) to adjust the elevation (arrow E) of the lens 70 relative to the image sensor 12. In practice, an operator manually rotates the barrel 60 by hand while watching an output of the imager 1 on a display until the picture is focused based on the operator's subjective evaluation. The operator then adheres the barrel 60 to the support 50 to secure the lens 70 in a position where it is spaced apart from the image sensor 12 by a suitable focus distance. This process is problematic because it is exceptionally time consuming and subject to operator errors.

Still another concern of conventional microelectronic imagers is the manufacturing costs for packaging the dies. The imager 1 shown in FIG. 1 is relatively expensive because manually adjusting the lens 70 relative to the image sensor 12 is very inefficient and subject to error. The conventional imager 1 shown in FIG. 1 is also expensive because each cover 40 is individually attached to the spacer 30, and each spacer 30 is individually attached to an interposer 20. Moreover, the support 50 and barrel 60 are individually assembled separately for each die 10 after the dies have been singulated from a wafer and attached to the interposer 20. Accordingly, there is a significant need to enhance the efficiency, reliability, and precision of packaging microelectronic imagers.

One aspect of forming the imager 1 is attaching the cover 40 to the spacer 30. The cover 40 can prevent contaminants from impairing the performance of the imager 1. However, one problem with positioning the cover 40 over the image sensor 12 is that the cover 40 can have defects and imperfections that degrade image quality. Furthermore, the defects and/or imperfections on the cover 40 can result in the image sensor 12 malfunctioning and/or becoming inoperable.

In certain cases, the cover 40 can be coated with an anti-reflective (AR) coating and/or an infrared (IR) blocking film to help improve the performance of the imager 1. This process, however, is undesirable because evaporative processes are typically used to deposit the AR coatings and the IR films. Evaporative processes are subject to splattering and/or flaking. For example, evaporative processes typically operate by applying a number of discrete sublayers to achieve the desired optical properties. One problem with this process is that a contaminant (e.g., a particle) can become lodged on an underlying sublayer of the AR/IR coatings and subsequent layers deposited over the underlying sublayer magnify the problem of the particle. This can cause shadowing on the image sensor 12. Furthermore, because the particle is embedded in the film stack, it cannot be removed from the coating. Therefore, there is a significant need to eliminate the performance degradation caused by the glass cover and improve the methods for forming AR/IR coatings.

DETAILED DESCRIPTION

A. Overview

Figure 1:
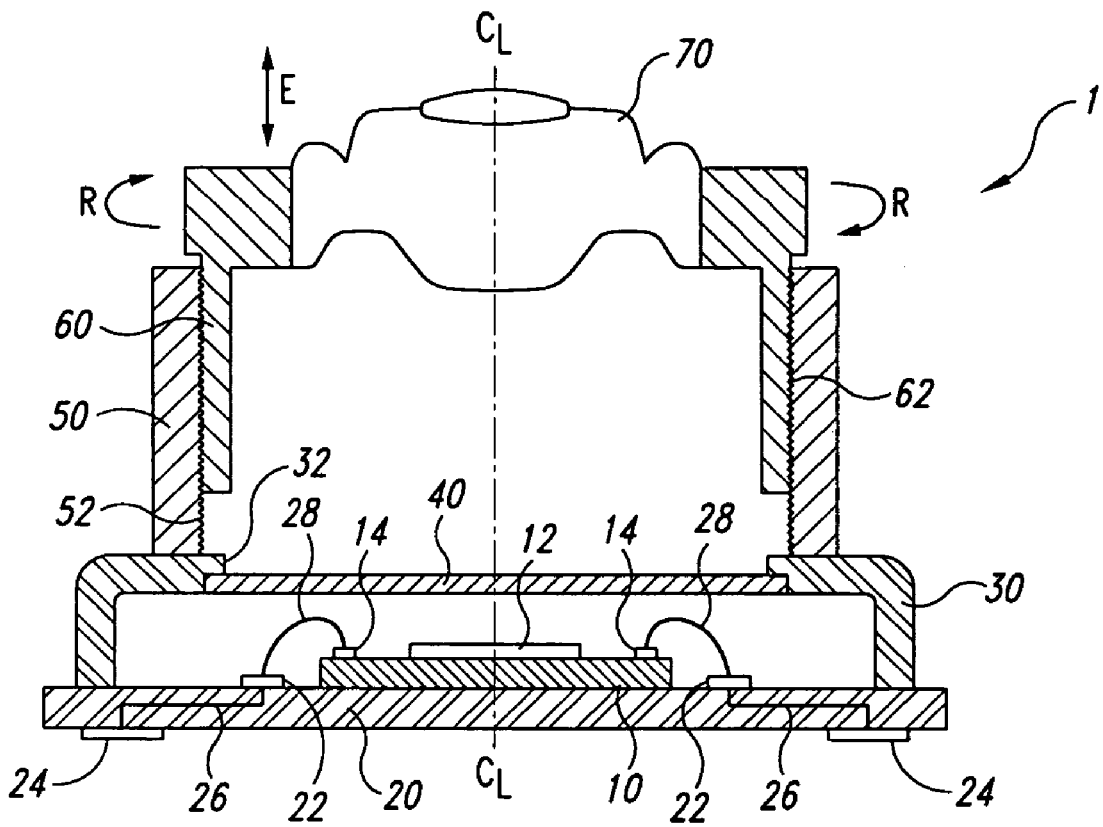
FIG. 1 is a schematic side cross-sectional view of a packaged microelectronic imager in accordance with the prior art.

The following disclosure describes several embodiments of methods for assembling optics supports and optical devices with microelectronic imaging units and several embodiments of microelectronic imagers that are formed using such methods. One embodiment comprises a method for manufacturing microelectronic imagers on an imager workpiece including a plurality of imaging dies on and/or in a substrate. The individual imaging dies have image sensors, integrated circuitry operatively coupled to the image sensors, and external contacts electrically coupled to the integrated circuitry. The method includes fixedly positioning optics supports at the imager workpiece before cutting the workpiece to singulate the individual imaging dies. The optics supports having openings aligned with corresponding image sensors and first interface features at reference locations relative to corresponding image sensors. The method continues by attaching optical devices to the optics supports. The optical devices are attached to the optics support by seating first interface features of the optics supports with second interface features of corresponding optical devices to position the optics elements at a desired location relative to corresponding image sensors. The method also includes adjusting the distance between the optical devices and corresponding image sensors by rotating individual optical devices with respect to corresponding optics supports.

Another aspect of the invention is directed toward a microelectronic imager assembly. One embodiment of such a microelectronic imager assembly comprises a workpiece having a substrate including a front side, a back side, and a plurality of imaging dies on and/or in the substrate, The imaging dies include image sensors at the front side of the substrate, integrated circuitry operatively coupled to the image sensors, and external contacts electrically coupled to the integrated circuitry. The imager assembly also includes optics supports on the workpiece. The optics supports have openings aligned with corresponding image sensors and first interface features at a reference distance relative to the image sensors. The first interface features include one or more inclined steps arranged about an axis. The individual steps have a ramp segment with an inclined surface curved about the axis and positioned at an inner diameter of the optics support. The imager assembly further includes optical devices having integral optics elements and second interface features. The second interface features include one or more complementary inclined steps seated with the one or more inclined steps of the corresponding first interface features to position the optics elements at a desired location relative to corresponding image sensors. In several embodiments, the first and second interface features are rotatably adjustable with respect to each other to position the individual optics elements at a desired location relative to corresponding image sensors.

Another aspect of the invention is directed toward a filtering layer. In several embodiments, the filtering layer is generally applied directly onto the image sensors. The filtering layer, which can include an anti-reflective film and/or an infrared blocking film, is applied before positioning the optics supports at the imager workpiece.

Several details of specific embodiments of the invention are described below with reference to CMOS imagers to provide a thorough understanding of these embodiments. CCD imagers or other types of sensors, however, can be used instead of the CMOS imagers in other embodiments of the invention. Several details describing well-known structures often associated with microelectronic devices may not be set forth in the following description for the purposes of brevity. Moreover, other embodiments of the invention can have different configurations or different components than those described in this section. As such, other embodiments of the invention may have additional elements or may not include all of the elements shown and described below with reference to FIGS. 2A-9.

B. Optics Supports and Optical Devices at the Wafer Level

Figure 2A:
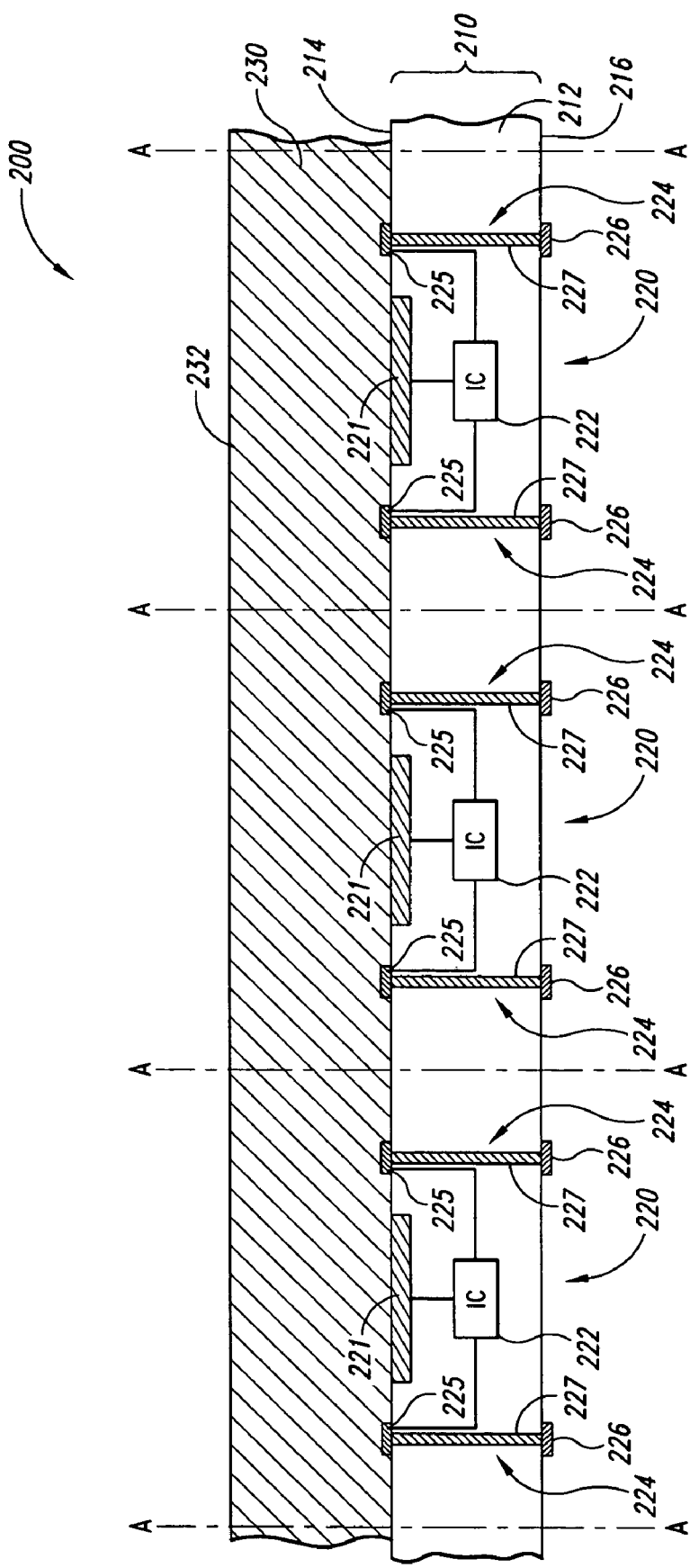
FIGS. 2A-2C are side cross-sectional views illustrating stages of a method for forming optics supports in accordance with an embodiment of the invention.
Figure 2B:
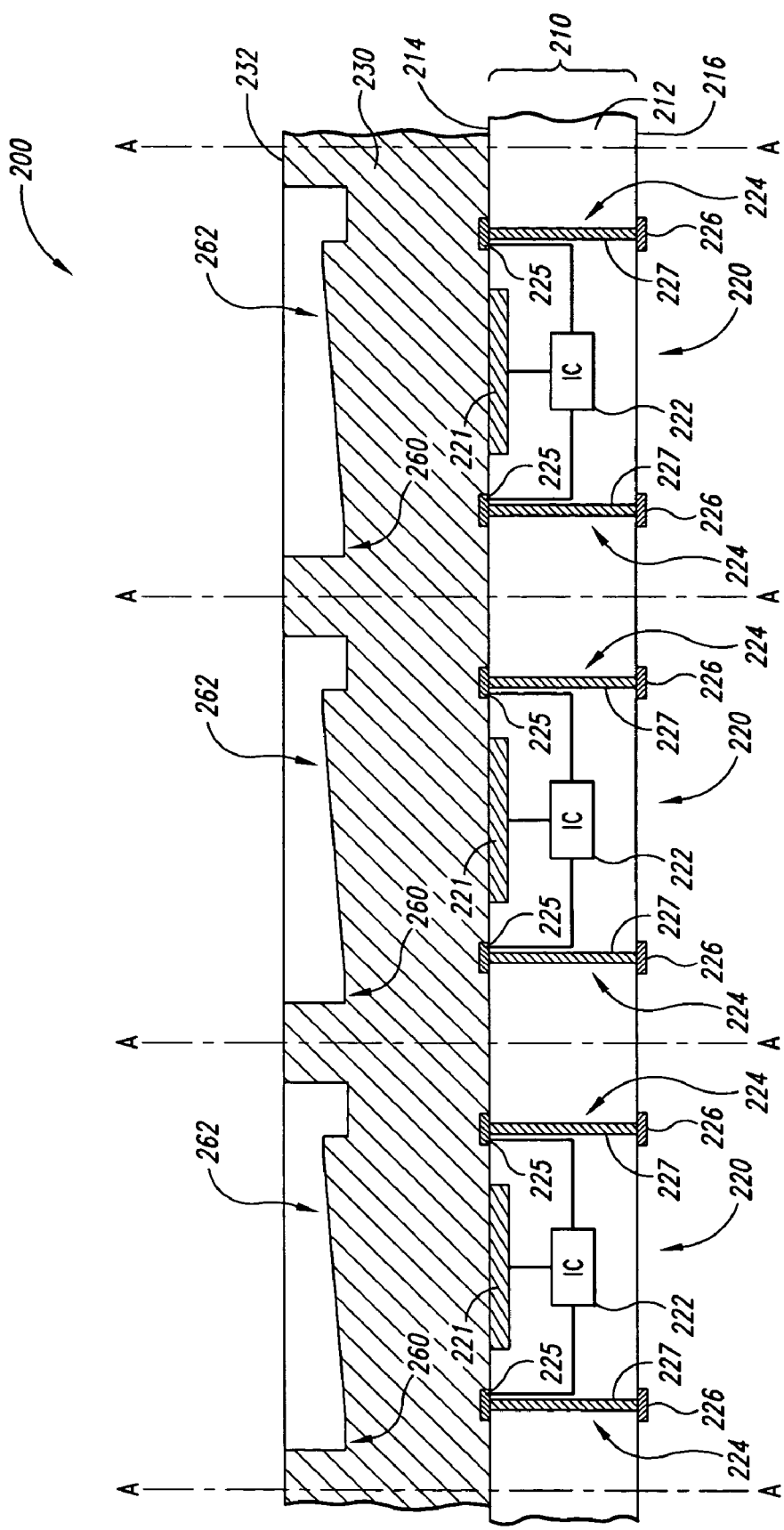
Figure 2C:
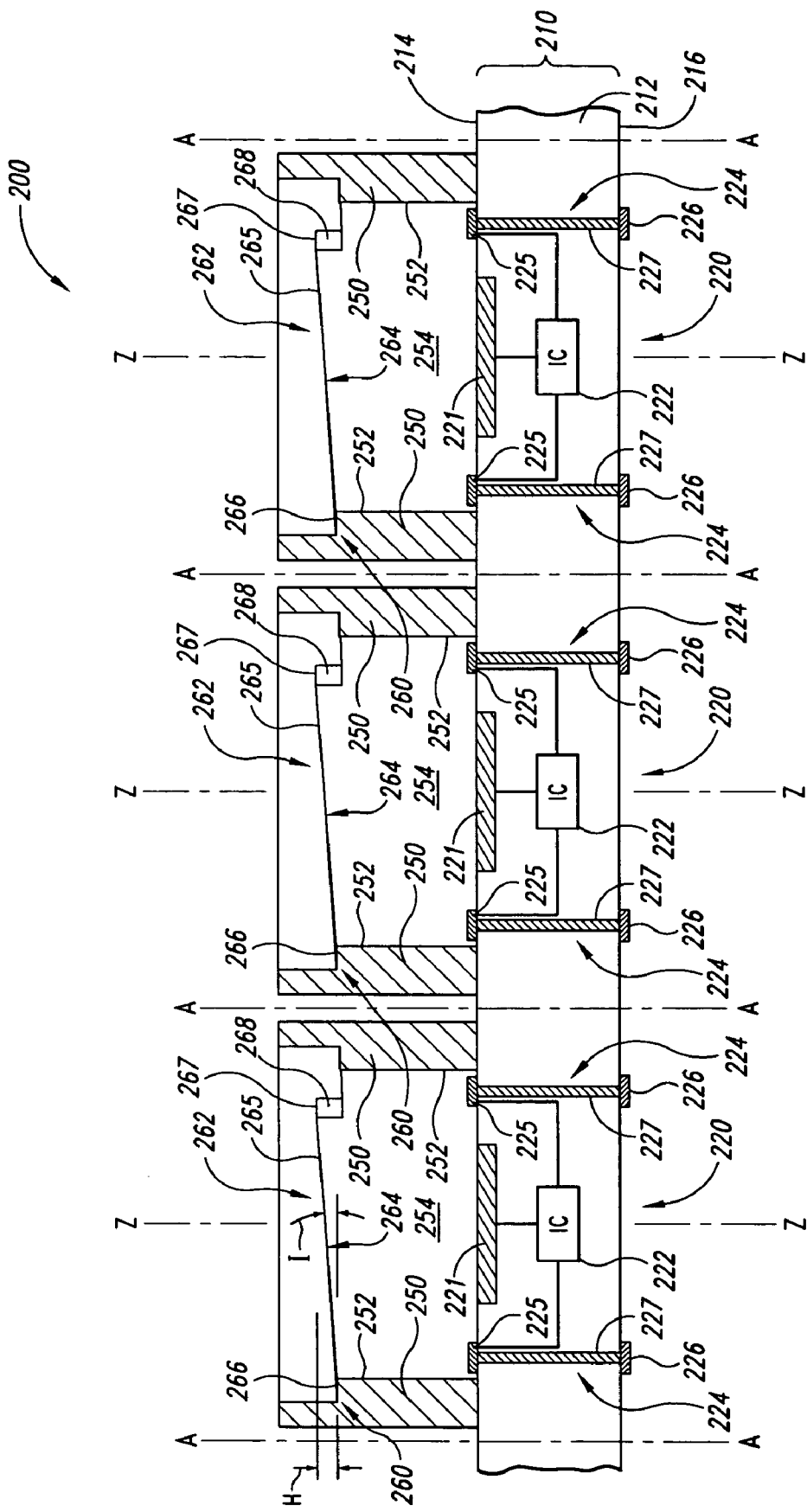

FIGS. 2A-2C illustrate stages in one embodiment of a method for forming optics supports that accurately position optical devices with respect to corresponding image sensors. FIG. 2A, for example, is a side cross-sectional view showing a portion of an assembly 200 fabricated in accordance with several embodiments of the invention. The assembly 200 includes an imager workpiece 210 having a first substrate 212 with a front side 214 and a back side 216. The imager workpiece 210 further includes a plurality of imaging dies 220 formed on and/or in the first substrate 212. Individual imaging dies 220 can include an image sensor 221, integrated circuitry 222 operatively coupled to the image sensor 221, and external contacts 224 electrically coupled to the integrated circuitry 222. The image sensors 221 can be CMOS or CCD image sensors for capturing pictures or other images in the visible spectrum, but the image sensors 221 can detect radiation in other spectrums (e.g., infrared radiation (IR) or ultraviolet (UV) ranges).

The embodiment of the external contacts 224 shown in FIG. 2A provides a small array of ball-pads within the footprint of the individual imaging dies 220. Each external contact 224, for example, can include a terminal 225 (e.g., a bond-pad), a contact pad 226 (e.g., a ball-pad), and a through-wafer interconnect 227 coupling the terminal 225 to the contact pad 226. The through-wafer interconnects 227 can be formed according to the processes disclosed in U.S. patent application Ser. No. 10/713,878, entitled "Microelectronic Devices, Methods For Forming Vias in Microelectronic Devices, and Methods for Packaging Microelectronic Devices," filed on Nov. 13, 2003, which is incorporated by reference herein in its entirety. Although the terminal 225 is shown at the front side 214, in other embodiments the imaging dies 220 may not include the terminals 225 on the front side 214 such that the integrated circuitry 222 is coupled directly to the contact pads 226 on the back side 216 of the first substrate 212 by through-wafer interconnects that extend only through a portion of the first substrate 212.

The optics supports can be made from a support material layer 230 deposited onto the front side 214 of the first substrate 212. The support material layer 230 can be applied to the first substrate 212 using vapor deposition processes (e.g., chemical vapor deposition or physical vapor deposition), spin-on techniques, spraying techniques, molding, or other processes. The support material layer 230 can alternatively be formed separately from the workpiece 210 and then attached to the first substrate 212. The support material layer 230 has an upper surface 232 at a desired distance from the front side 214 of the first substrate 212 to define a reference plane relative to the image sensors 221. The upper surface 232 can be formed at a precise distance from the front side 214 of the first substrate 212 by planarizing the support material layer 230 using chemical-mechanical planarization. In several embodiments, however, the deposition process can produce the upper surface 232 at the desired distance from the front side 214 of the first substrate 212 without planarizing the support material layer 230. The support material layer 230 can be composed of polymeric materials, ceramics, metals, and/or other suitable materials.

Referring to FIG. 2B, the support material layer 230 is then etched, mechanically machined, and/or laser cut to form a plurality of first interface features 260 that provide axial adjustment of an optical device to accurately situate an optics element at a desired location with respect to corresponding image sensors 221. For example, one or more first inclined steps 262 are formed in the support material layer 230 at desired locations relative to corresponding image sensors 221. In this embodiment, the first interface features 260 include only a single inclined step 262, but in other embodiments described below the first interface features may include a plurality of inclined steps.

Referring next to FIG. 2C, sidewalls 252 superimposed relative to a perimeter zone around the corresponding image sensors 221 are formed through the support material layer 230. The sidewalls 252 of the optics supports 250 define openings 254 aligned with corresponding image sensors 221. The openings 254 are generally sized so that the optics supports 250 do not obstruct the image sensors 221, but this is not necessary. In several instances, the openings 254 of the optics supports 250 are larger than the image sensors 221 to allow more light to reach the image sensors 221.

In an alternative embodiment, the optics supports 250 shown in FIG. 2C can be formed using three-dimensional stereo-lithography processes known to persons skilled in the art. The optics supports 250, for example, can be erected in the configuration shown in FIG. 2C such that a blanket layer of support material is not deposited onto the workpiece and then etched. After erecting the optics supports 250 using a stereo-lithography technique, fine features can be etched or otherwise machined into the stereo-lithography material. Suitable three-dimensional stereo-lithography processes and apparatus for constructing the optics supports 250 are made by 3-D Systems, Inc. of Valencia, Calif.

In another alternative embodiment, the optics supports 250 shown in FIG. 2C can be formed using an injection molding process that creates one or more of the supports in a single injection mold. For example, a plurality of optics supports 250 having the features shown in FIG. 2C can be formed in an injection mold in an arrangement corresponding to the pattern image sensors 221 on the workpiece 210. The optics supports 250 can be attached to the workpiece 210 either before of after being separated from each other.

Figure 2D:
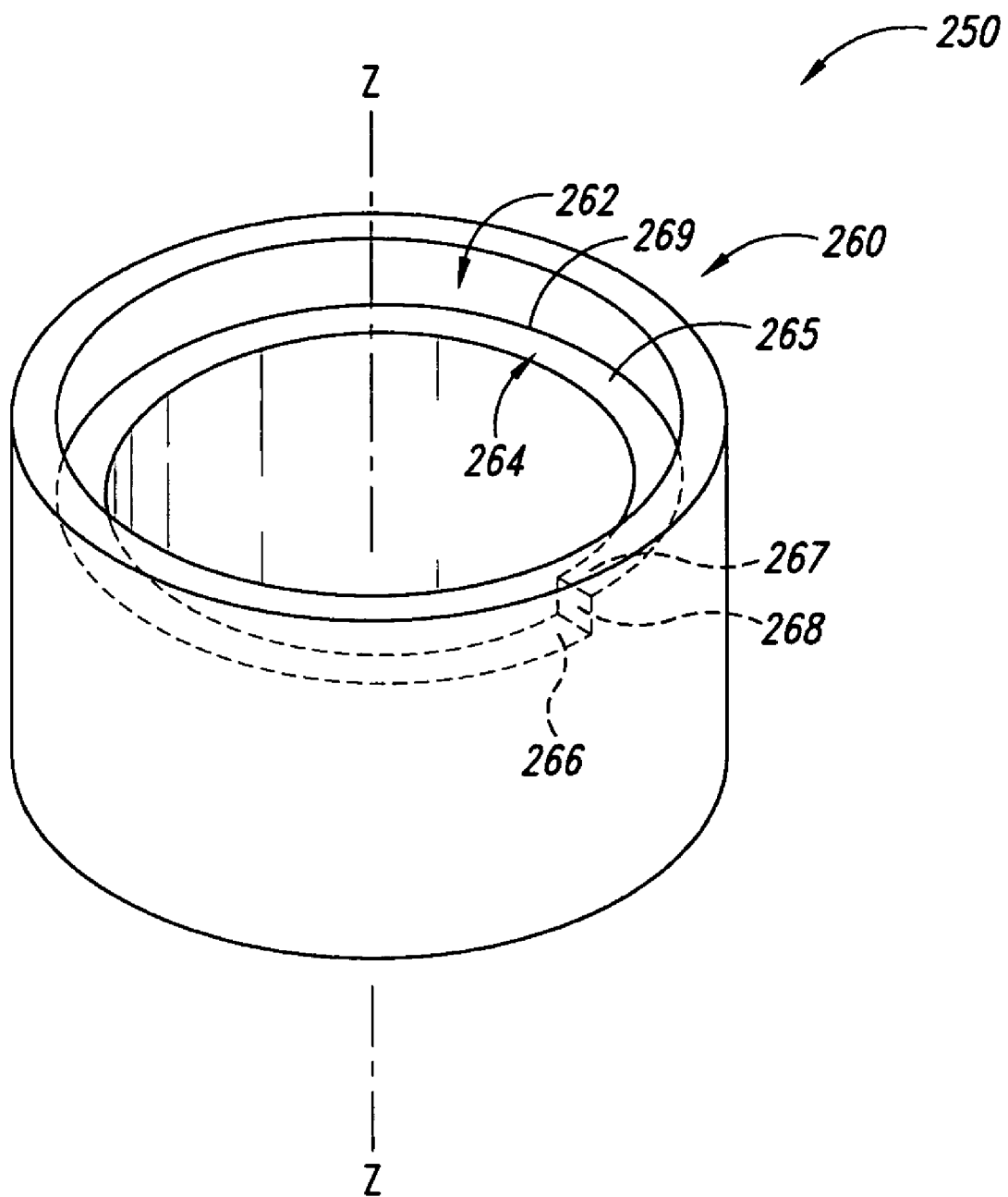
FIG. 2D is an isometric view of an embodiment of one of the optics support of FIG. 2C.

FIG. 2D is an isometric view of an embodiment of one of the individual optics support 250 shown in FIG. 2C. Referring to FIGS. 2C and 2D together, the individual first inclined steps 262 extend concentrically about an adjustment axis (represented by the z-axis). In the embodiment shown in FIG. 2D, the first inclined step 262 is an adjustable stop component that extends approximately 360° around the adjustment axis. The individual first inclined steps 262 each include a first ramp segment 264 projecting inwardly normal to an inner wall of the optics support 250 and have an inclined surface 265 with a lower portion 266, an upper portion 267, and a riser 268. The first interface features 260 further include axial alignment components 269. The alignment components 269 are spaced laterally apart from the centerline of the image sensors 221 (represented by the z-axis) to provide a fixed surface at a known radial distance from the image sensors 221 for accurately aligning the optics elements with the image sensors 221. The first interface features 260 can be formed according the processes described in U.S. patent application Ser. No. 10/910,491, entitled "Microelectronic Imagers with Optics Supports Having Threadless Interfaces and Methods for Manufacturing Such Microelectronic Imagers," filed on Aug. 2, 2004 (Perkins Coie Docket No. 108298773US00), which is incorporated by reference herein in its entirety. As explained in more detail below, the inclined steps 262 provide axial adjustment of the focal distance for the optics elements to space the optics elements apart from corresponding image sensors 221 by a desired distance.

The lower portions 266 of the inclined surfaces 265 are at a first common elevation with respect to the image sensors 221 and the upper portions 267 are at a second common elevation with respect to the image sensors 221. The difference between the first and second elevations (shown as H) defines an angle of inclination I. As described below, the complementary interface features of the optical devices can be rotatably adjusted between the lower portions 266 and upper portions 267 of the inclined surfaces 265 to position the optics elements at a desired focus distance from corresponding image sensors 221. The angle of inclination I can vary depending on the level of accuracy required for positioning the optics elements. For example, a smaller angle of inclination provides better fine tuning for positioning the optics elements at a desired location relative to the image sensors 221. On the other hand, a larger angle of inclination I provides greater vertical displacement for each degree of rotation to provide a larger range.

Figure 3A:
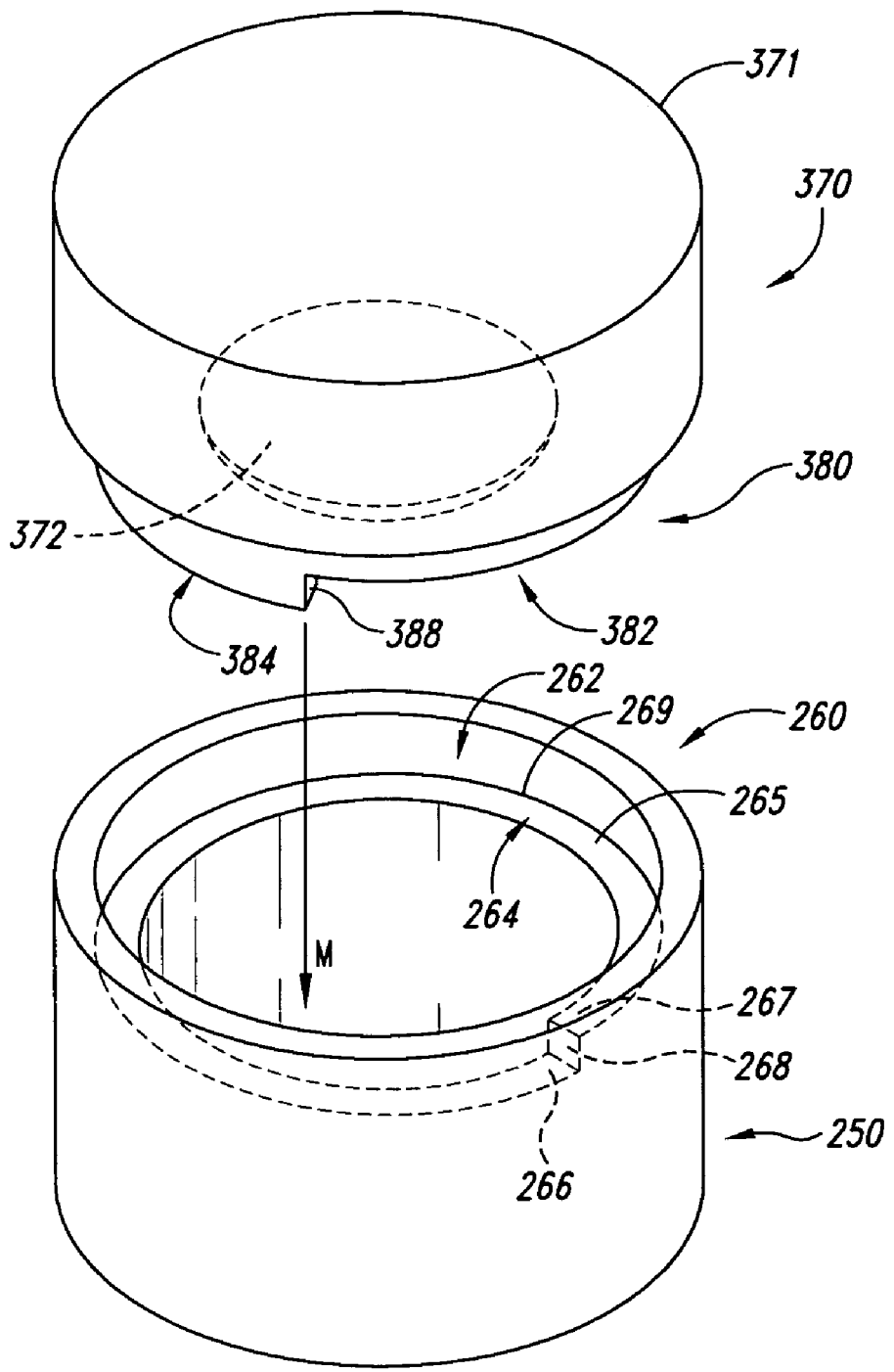
FIG. 3A is an isometric view of an individual optics support and optical device before installing the optical device with the optics support.

After the optics supports 250 have been formed, optical devices are mounted to the optics supports 250 to form microelectronic imagers. FIG. 3A is an isometric view of an individual optical device 370 and a corresponding optics support 250 before installing the optical device to the optics support. The optical device 370 in the embodiment shown in FIG. 3A has been singulated before being mounted to the optics support 250. The optical device 370 can include a second substrate 371, an optics element 372, and a second interface feature 380. The optical device 370 is a single unitary component in which the second substrate 371, optics element 372, and second interface features 380 are integral pieces of a single material. The optical device 370 can be formed by molding a compound to form the second substrate 371 that carries the optics element 372 and the second interface feature 380. For example, the optical device 370 can be formed in an injection molding process in which the optics element 372 and second interface feature 380 are molded integrally with the second substrate 371.

The optical device 370 is accordingly made from a suitable compound such as glass, quartz, plastics, and/or other materials that can be molded into the desired shape and provide the desired transmission properties for the radiation. For example, when the imaging dies 220 (FIG. 2C) are for use in digital cameras, the second substrate 371 is transmissive to light in the visible spectrum. The second substrate 371, however, can be transmissive to UV light, IR, and/or any other suitable spectrum according to the particular application of the imaging die 220 (FIG. 2C). In embodiments directed toward imaging radiation in the visible spectrum, the second substrate 371 can also have films that filter UV, IR, or other undesirable spectrums of radiation. The second substrate 371, for example, can be formed of a material and/or have a coating that filters IR or near IR spectrums, and the second substrate 371 can have an anti-reflective coating. These films and/or coatings can be in lieu of or in addition to the filtering layer described below. The optics elements 372 are configured to manipulate the radiation for use by the image sensors 221 (FIG. 2C). For example, the optics elements 372 can include focus lenses, dispersion lenses, pin-hole lenses, filters, and/or anti-reflective films.

The second interface feature 380 of the optical device 370 in FIG. 3A includes a complementary second inclined step 382. The second inclined step 382 is an adjustable stop component having a second ramp segment 384 projecting inwardly normal to an inner wall of the optical device 370 and configured to mate or otherwise interface with the first ramp segment 264 of the first inclined step 262. The second inclined step 382 also has a riser 388 between lower and upper portions of the second ramp segment 384. In the illustrated embodiment, the first interface feature 260 (having a female configuration) of the optics supports 250 is mated with the corresponding second interface feature 380 (having a male configuration) of the optical device 370. More specifically, the first interface feature 260 has an outer surface with a first cross-sectional dimension and the second interface feature 380 has an inner surface with a second cross-sectional dimension greater than the first cross-sectional dimension. The first interface feature 260 of the optics support 250 is received within the second interface feature 380 of the optical device 370. In other embodiments, the male/female configuration can be reversed (i.e., the first interface feature 260 has a male configuration and the second interface feature 380 has a female configuration). As described in detail below, the mated first and second interface features 260 and 380 provide adjustment of the focal distance for the individual optical device 370 with respect to the corresponding image sensor 221 (FIG. 2C).

Figure 3B:
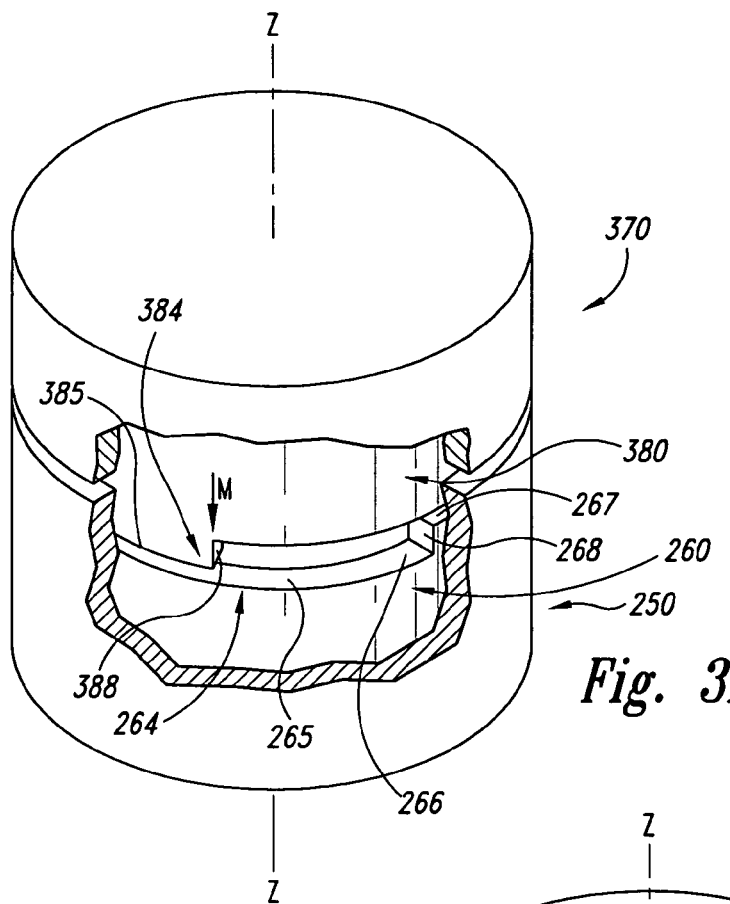
FIG. 3B is an isometric view including a cut-out portion of the optics support and optical device of FIG. 3A after the optical device and optics support are seated with each other.

FIG. 3B is an isometric view including a cut-out portion of the optical device 370 and optics support 250 after they have been seated together. Referring to FIGS. 3A and 3B together, the second ramp segment 384 of the optical device 370 is seated with the complementary first ramp segment 264 of the optics support 250. For example, in the illustrated embodiment the riser 388 between the lower and upper portions of the second ramp segment 384 is initially positioned (as shown by the arrow M) proximate a midpoint of the corresponding first ramp segment 264 of the optics support 250. In other embodiments, the second ramp segment 384 of the optical device 370 can be seated at different locations along the corresponding first ramp segment 264 of the optics support 250.

Figure 3C:
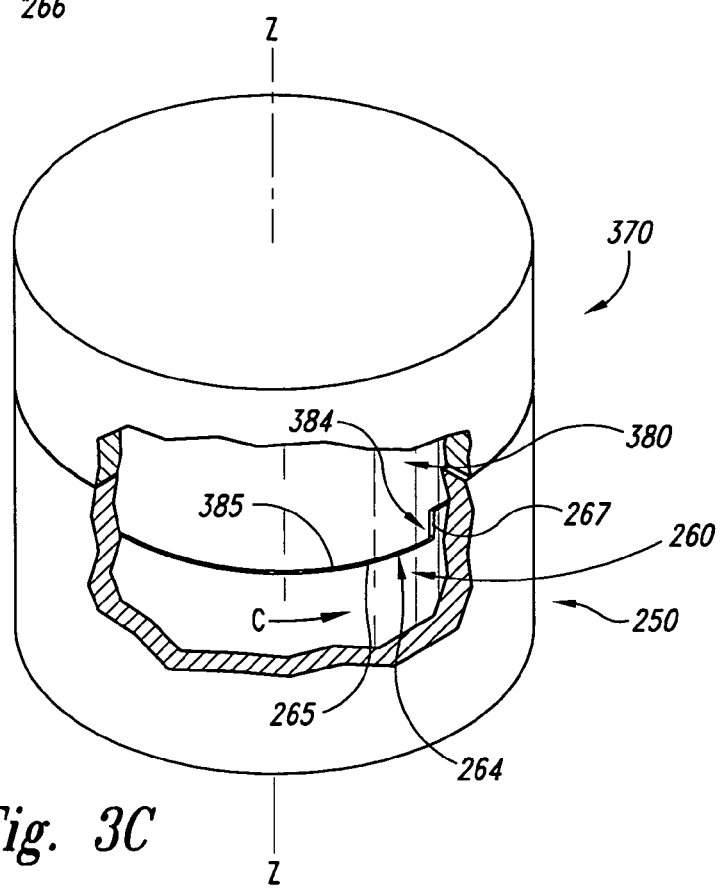
FIG. 3C is an isometric view including a cut-out portion of the individual optics support and optical device of FIG. 3B after the optical device and optics support are seated together and rotationally adjusted with respect to each other.

After seating the first and second interface features 260 and 380 together, the individual optical device 370 can be rotatably adjusted relative to the corresponding optics support 250 in a clockwise and/or counterclockwise direction to position the optics element 372 (FIG. 3A) at a desired focal distance along the z-axis from the corresponding image sensor 221 (FIG. 2C). FIG. 3C is an isometric view including a cut-out portion of the optics support 250 and optical device 370 of FIG. 3A after the first and second interface features 260 and 380 have been seated together and rotatably adjusted. In the illustrated embodiment, for example, the optical device 370 was rotated along the optics support 250 in a counterclockwise direction (as shown by the arrow C) to a different rotational position. More specifically, the second ramp segment 384 was rotatably moved along the first ramp segment 264 in the direction C to move the optics element 372 (FIG. 3A) from a first elevation to a second lower elevation along the z-axis based on the slope of the inclined surfaces 265 and 385 and the distance the second ramp segment 384 was rotated along the first ramp segment 264.

When the optics element 372 (FIG. 3A) is at the desired location, the optical device 370 can be secured to the optics support 250 along the first and second interface features 260 and 380 using an adhesive, a heat stake (e.g., a type of thermoset adhesive), and/or an interference fit. For example, the optical device 370 can be secured to the optics support 250 using a UV curing adhesive.

The optical devices 370 can have a plurality of individual optics elements in addition to the optics element 372 illustrated in FIGS. 3A and 3B. For example, one embodiment of the optical device 370 includes additional lenses, filters or other optic members attached to the second substrate 371 in addition to the optics element 372. The second substrate 371 can be configured into a housing with steps to support the optics element 372 and any additional optics elements, or the additional optics elements can be mounted to a separate housing that can be attached to the second substrate 371. The additional optics elements are generally incorporated into the optical devices 370 before mounting the optical devices to the optics supports 250.

Figure 3D:
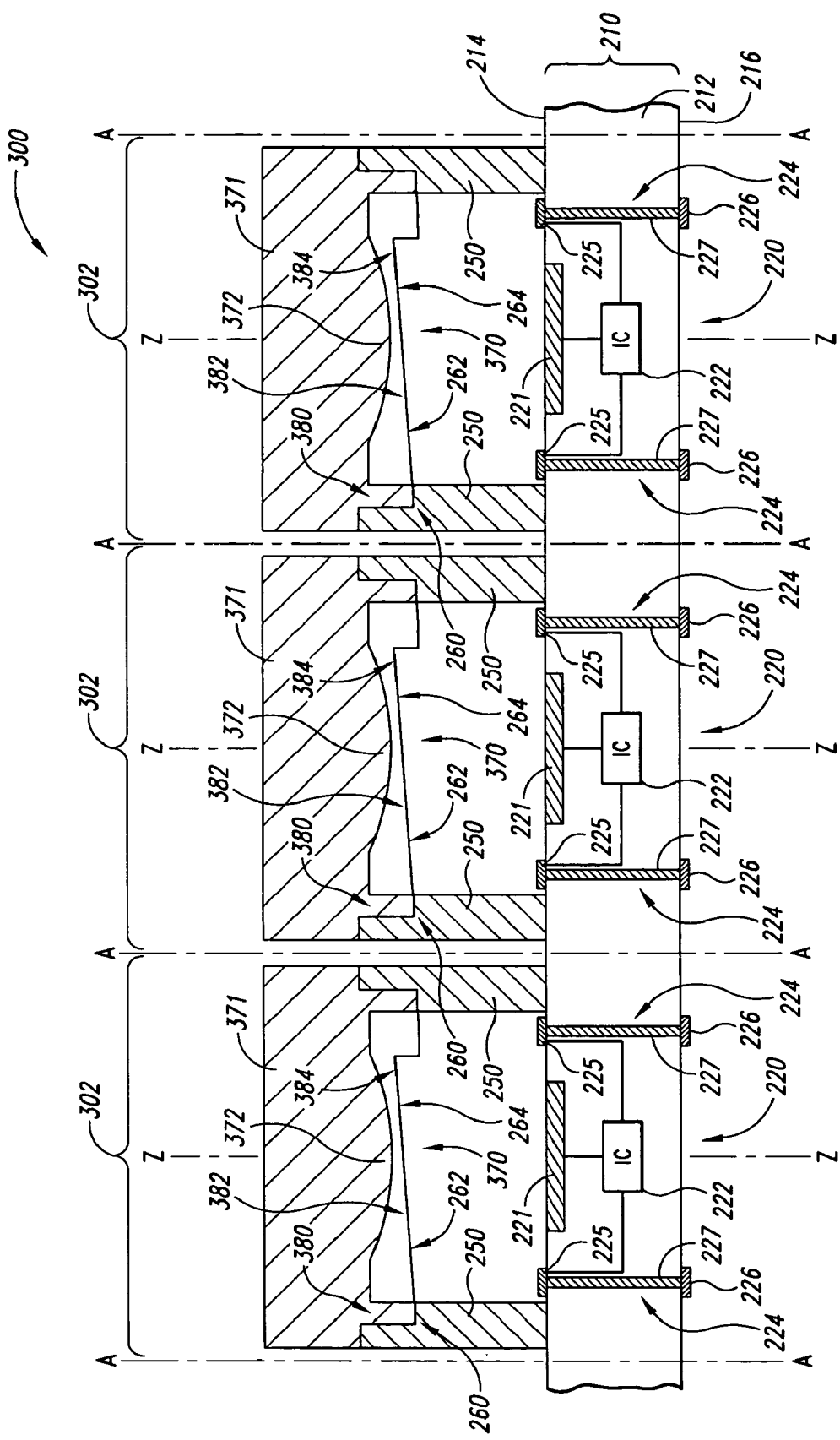
FIG. 3D is a side cross-sectional view illustrating a plurality of microelectronic imagers, optics supports, and optical devices assembled at the wafer level in accordance with an embodiment of the invention.

FIG. 3D is a side cross-sectional view of an assembly 300 fabricated at the wafer level such that a plurality of optical devices 370 are mounted to corresponding optics supports 250 to form imagers 302 before singulating the first substrate 212 to separate the individual imagers 302 from each other. The embodiment of the imagers 302 shown in FIG. 3D is expected to significantly improve the efficiency of packaging imagers compared to the conventional imager of FIG. 1. For example, the optical devices 370 can be attached to the optics supports 250 using automated equipment because the interface between the optical devices and optics supports inherently positions the optics elements 372 at a location relative to corresponding image sensors 221. In addition, the optical devices 370 can be rotatably adjusted relative to the optics supports 250 using automated equipment while automatically testing the focus of the optics elements 372 with respect to corresponding image sensors 221. The imagers 302 accordingly eliminate manually positioning and focusing individual lenses with respect to image sensors, as described above with respect to the conventional imager of FIG. 1. Therefore, the structure of the imagers 302 enables processes that significantly enhance the throughput and yield of packaging microelectronic imagers.

Another feature of the microelectronic imagers 302 illustrated in FIG. 3D is that the interface between first interface features 260 of the optics supports 250 and second interface features 380 of the optical devices 370 provides better alignment of the optical devices 370 and corresponding image sensors 221. For example, unlike the threaded interface between the support 50 and barrel 60 in FIG. 1, there is no clearance between the first and second ramp segments 264 and 384 when the first and second interface features 260 and 380 are seated together. Accordingly, the z-axis of individual optical devices 370 is coincident with the z-axis of corresponding image sensors 221. Furthermore, the optical devices 370 are rotationally adjusted no more than 360° with respect to corresponding optics supports 250. Accordingly, the adjustment process is fast and accurate.

Figure 4A:
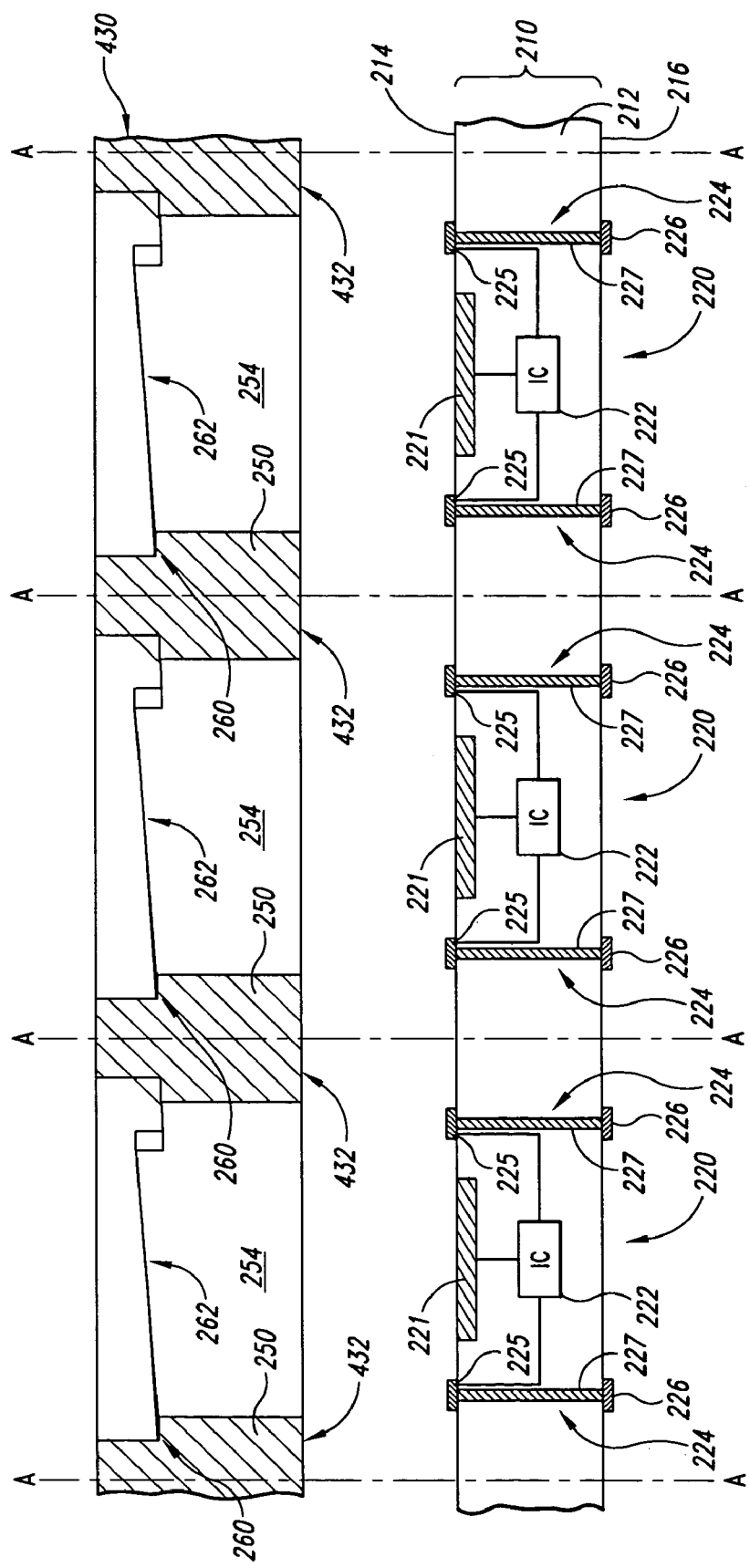
FIGS. 4A and 4B are side cross-sectional views illustrating stages of a method for installing optics supports in accordance with another embodiment of the invention.
Figure 4B:
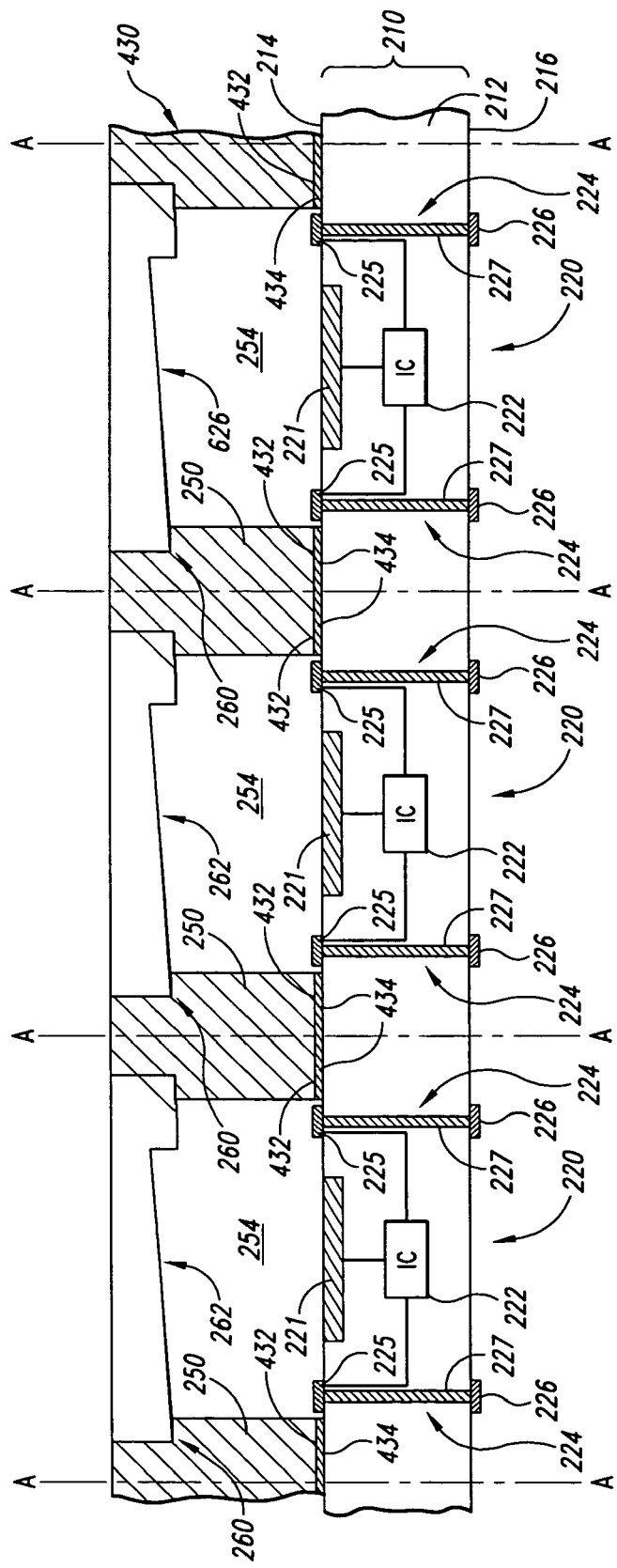

FIGS. 4A and 4B illustrate a method for fabricating the optics supports 250 in accordance with another embodiment of the invention. Referring to FIG. 4A, the optics supports 250 can be formed separately from the imager workpiece 210 and then attached to the imager workpiece 210 at the wafer level. The optics support 250, for example, can be made from a support material layer 430 composed of a polymeric material, glass, or another suitable material. The first interface features 260 and the openings 254 can be formed by injection molding the support material. For example, a polymeric material or glass can be molded to form the optics support 250 having the first interface features 260 with inclined steps 262. In another embodiment, the support material layer 430 can initially be a solid wafer in which the first interface features 260 and openings 254 are formed by etching, machining, and/or ablating the support material layer 430. The optics supports 250 in this embodiment include footings 432 on the back side of the support material layer 430.

FIG. 4B illustrates another stage in this embodiment in which the footings 432 of the optics supports 250 are attached to the front side 214 of the first substrate 212. The footings 432 can be secured to the first substrate 212 using an adhesive 434. The optics supports 250 are accordingly constructed on the imager workpiece 210 by attaching a plurality of the optics supports 250 to the first substrate 212 before singulating the imager workpiece 210. The optical devices 370 (FIG. 3D) can then be attached to the optics supports 250 as described above.

Figure 5:
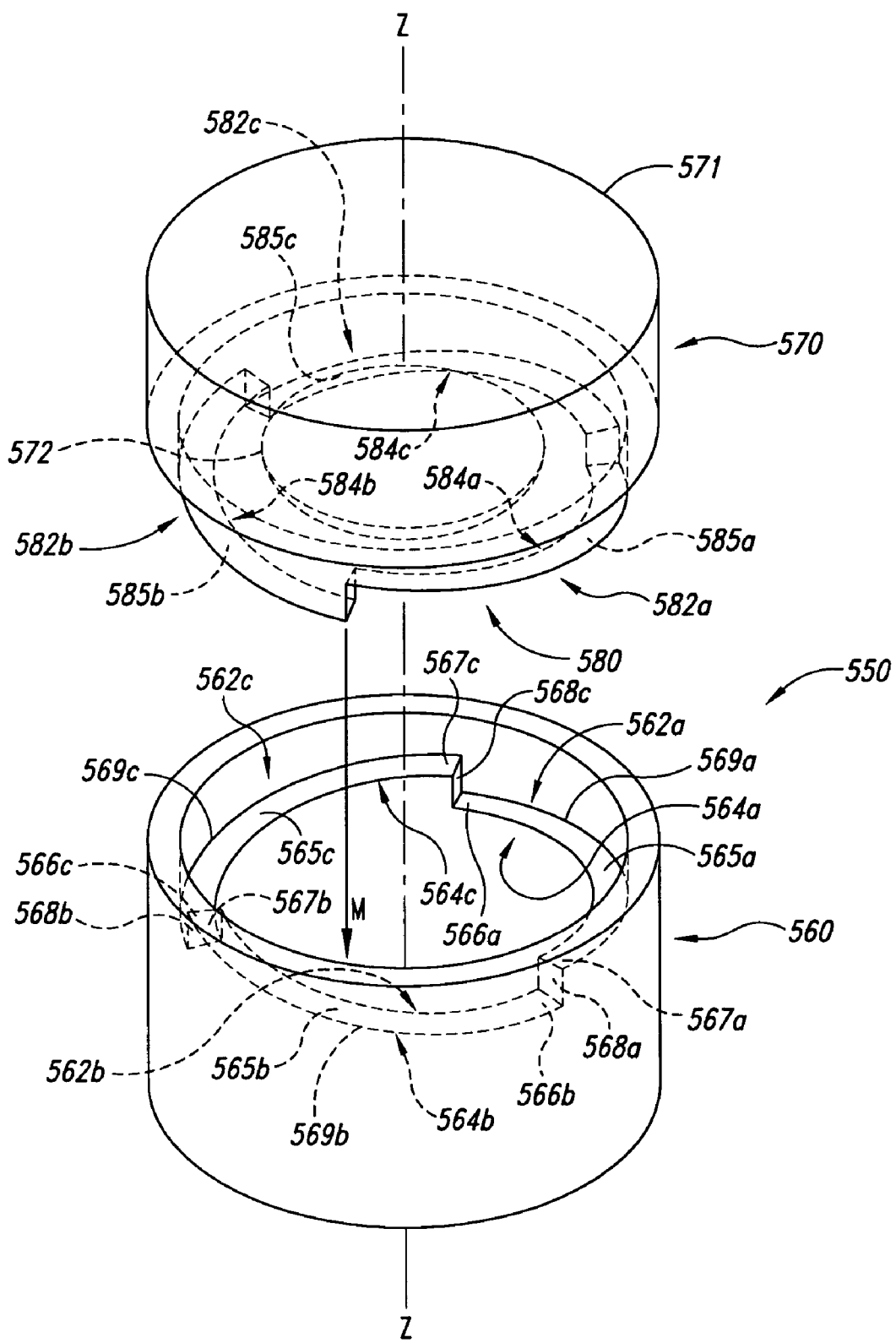
FIG. 5 is an isometric view of an individual optics support and optical device before installing the optical device with the optics support in accordance with another embodiment of the invention.

FIG. 5 is an isometric view of an individual optical device 570 and corresponding optics support 550 before installing the optical device to the optics support in accordance with another embodiment of the invention. The primary difference between the optics support 550 shown in FIG. 5 and the optics support 250 in FIG. 3A is that the optics support 550 include a first interface feature 560 having a plurality of inclined steps 562 (identified individually by reference numbers 562a-c) at a common elevation around an inner diameter of the optics support 550. The inclined steps 562 are adjustable stop components having ramp segments 564 (identified individually by reference numbers 564a-c). In the illustrated embodiment, the ramp segments 564a-c are arranged concentrically about an adjustment axis (represented by the z-axis). The ramp segments 564a-c project inwardly normal to the inner diameter of the optics support 550 and have inclined surfaces 565a-c with lower portions 566a-c and upper portions 567a-c. The lower portions 566a-c of the inclined surfaces 565a-c are at a first common elevation with respect to an image sensor (not shown) and the upper portions 567a-c are at a second common elevation with respect to the image sensor (not shown). The ramp segments 564a-c also include risers 568a-c. The first interface feature 560 also includes axial alignment components 569a-c to provide a fixed surface at a known radial distance from the image sensor (not shown) for accurately aligning a lens or optic member with the image sensor.

The optical device 570 in the embodiment shown in FIG. 5 can include a second substrate 571, an optics element 572, and a second interface feature 580. The optical device 570 is a single unitary component in which the second substrate 571, optics element 572, and second interface feature 580 are integral pieces of a single material. The optical device 570 can be formed of materials generally similar to those of the optical device 370 described above with respect to FIG. 3A. The optics element 572 is configured to manipulate the radiation for use by a corresponding image sensor (not shown) and can be generally similar to the optics element 372 described above in FIG. 3A.

The second interface feature 580 includes a plurality of inclined steps 582 (identified individually by reference numbers 582a-c) at a common elevation around an inner diameter of the optical device 570. The inclined steps 582 are adjustable stop components having ramp segments 584a-c arranged concentrically about the adjustment axis. The ramp segments 584a-c project inwardly normal to the inner diameter of the optical device 570 and have inclined surfaces 585a-c configured to contact the complementary inclined surfaces 565a-c of the optics support 550 to accurately situate the optics element 572 at a desired location with respect to a corresponding image sensor (not shown). In this embodiment, the first interface feature 560 of the optics support 550 has a female configuration and the second interface feature 580 of the optical device 570 has a male configuration. In other embodiments, the male/female configuration of the first and second interface features 560 and 580 may be reversed.

Figure 6A:
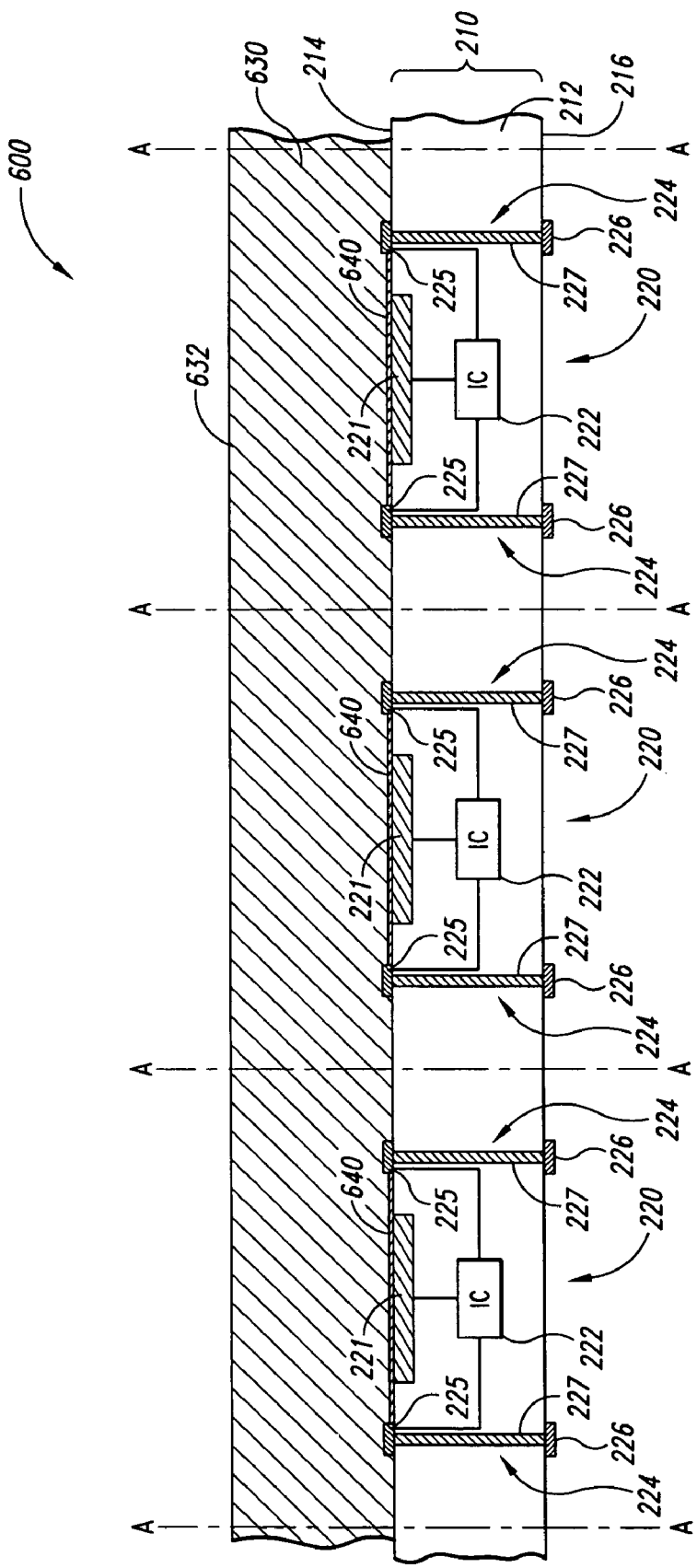
FIGS. 6A-6E are side cross-sectional views illustrating stages of a method for forming optics supports and installing optical devices in accordance with yet another embodiment of the invention.

C. Further Embodiments of Optics Supports and Optical Devices at the Wafer Level FIGS. 6A-6E illustrate a method for fabricating optics supports and optical devices in accordance with another embodiment of the invention. FIG. 6A shows an assembly 600 at a point in the process that is similar to the assembly 200 illustrated in FIG. 2A. The methods shown in FIGS. 6A-6E, however, differ from those described above with reference to FIGS. 2A-2C in that the interface features of the optics supports and optical devices have a different configuration and the imager workpiece 210 includes a filtering layer 640 applied to the front side 214 of the first substrate 212.

Referring to FIG. 6A, the filtering layer 640 is deposited directly on the image sensors 221, but in other embodiments the filtering layer 640 may be deposited over the entire front side 214 of the first substrate 212 and an etching process can be used after application of the filtering layer 640 to expose the terminals 225. In further embodiments, the filtering layer 640 may be applied to the image sensors in any of the embodiments described above in FIGS. 2A-5. In still further embodiments, the filtering layer 640 may be applied to portions of the optical devices (not shown) in addition to or in lieu of applying the filtering layer 640 to the image sensors 221. The filtering layer 640 can include one or more stratums of AR films and/or stratums of IR blocking films. The filtering layer 640 can be deposited onto the first substrate 212 using vapor deposition processes (e.g., chemical vapor deposition or atomic layer deposition) or other processes known to those in the art.

One advantage of using vapor deposition processes to apply the filtering layer 640 is that the procedures are performed using clean room processes. Accordingly, the likelihood of contaminants becoming lodged in the filtering layer 640 is mitigated. Applying the filtering layer 640 directly on the image sensors 221 will reduce the need for installing a separate cover plate over the image sensors 221, which will improve transmission (e.g., better dynamic range and signal-to-noise ratio), reduce ghost images and back reflection, and reduce the overall cost of the assembly. Furthermore, the addition of the filtering layer 640 will also reduce tolerance buildup because there will be fewer elements in the assembly.

After the filtering layer 640 has been applied, a support material layer 630 can be deposited onto the workpiece 210 using vapor deposition processes as described above with respect to FIG. 2A. The support material layer 630 can be composed of polymeric materials, ceramics, metals, and/or other suitable materials as described above in FIG. 2A.

Figure 6B:
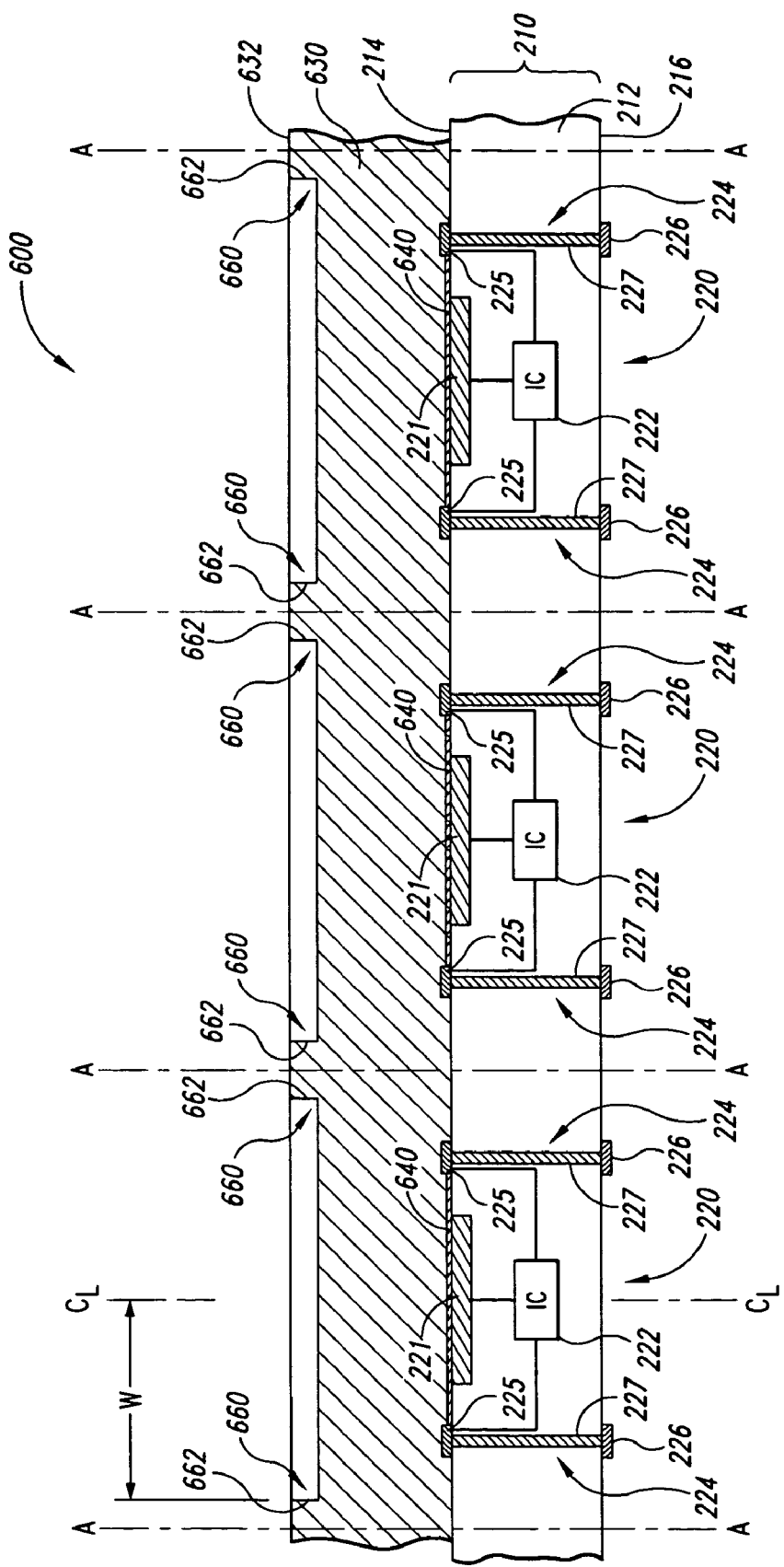

A plurality of first interface features 660 are then etched, mechanically machined, and/or laser cut into an upper portion 632 of the support material layer 630. Referring to FIG. 6B, for example, the upper portion 632 of the support material layer 630 is etched to an intermediate depth using a first etch, such as an anisotropic etch, to form first alignment components 662 at a desired lateral location relative to the corresponding image sensors 221. The first alignment components 662 provide a fixed surface at a known position for accurately positioning optical devices at a predetermined location relative to the image sensors 221. For example, the first alignment components 662 are laterally spaced apart from the centerline $C_L$-$C_L$ of corresponding image sensors 221 by a precise distance W to engage the edges of optical devices and align optics elements with corresponding imager sensors 221.

Figure 6C:
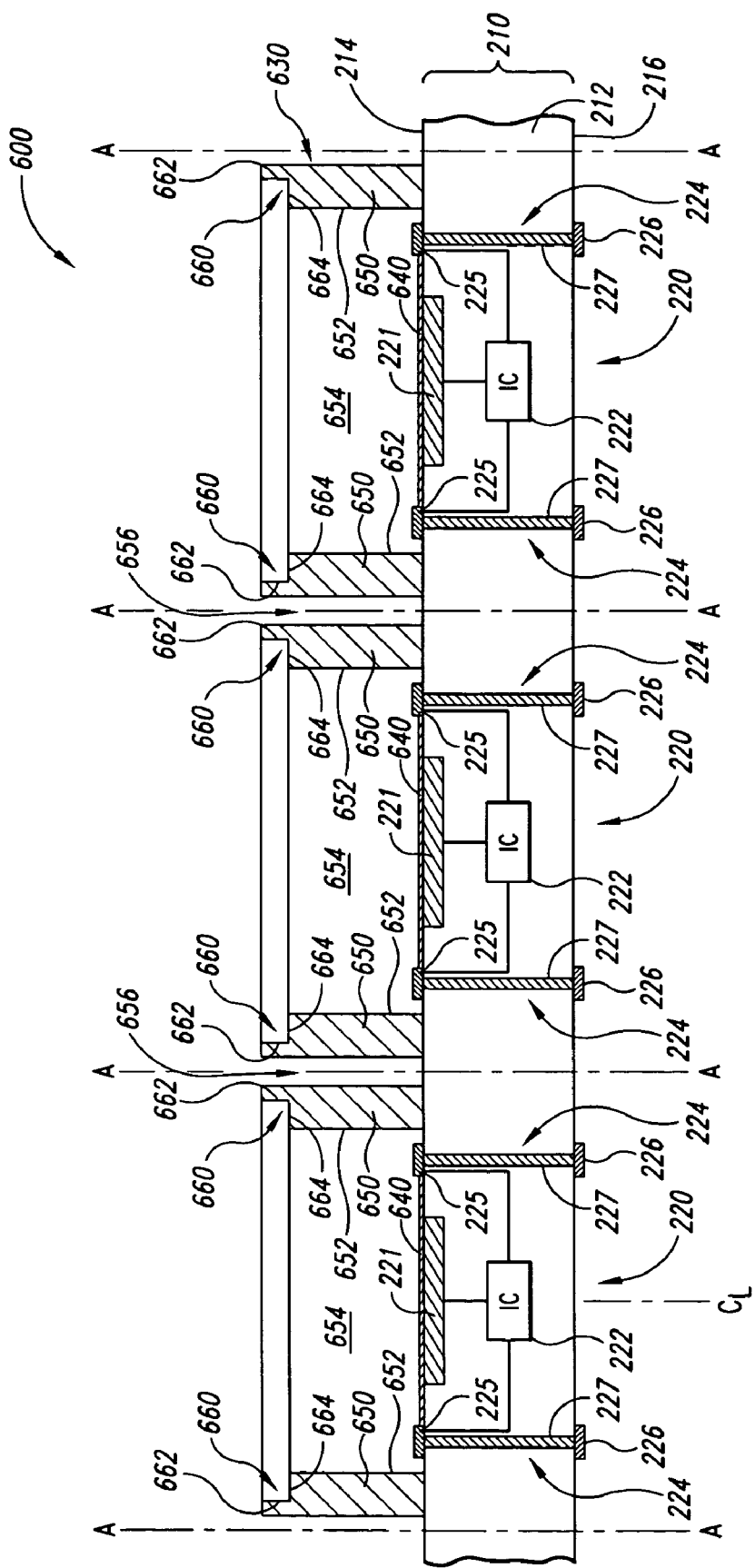

The first stop components 664 of the first interface features 660 and openings 654 are then formed from the remaining portion of the support material layer 630. Referring to FIG. 6C, a second etch forms the stop components 664 at a desired distance relative to the image sensors 221. The first stop components 664 provide a fixed surface at a known elevation for accurately positioning optical devices at a desired position relative to the image sensors 221. The second etch also forms sidewalls 652 that are superimposed relative to a perimeter zone around corresponding image sensors 221. The sidewalls 252 shape the openings 254 so that they are aligned with corresponding image sensors 221. The second etch shown in FIG. 6C can also form gaps 656 between individual optics supports 650. The second etch can be an anisotropic etch that is stopped at or slightly before the front side 214 of the first substrate 212. In an alternative embodiment, the first interface features 660 and openings 654 may be formed using laser ablation.

Figure 6D:
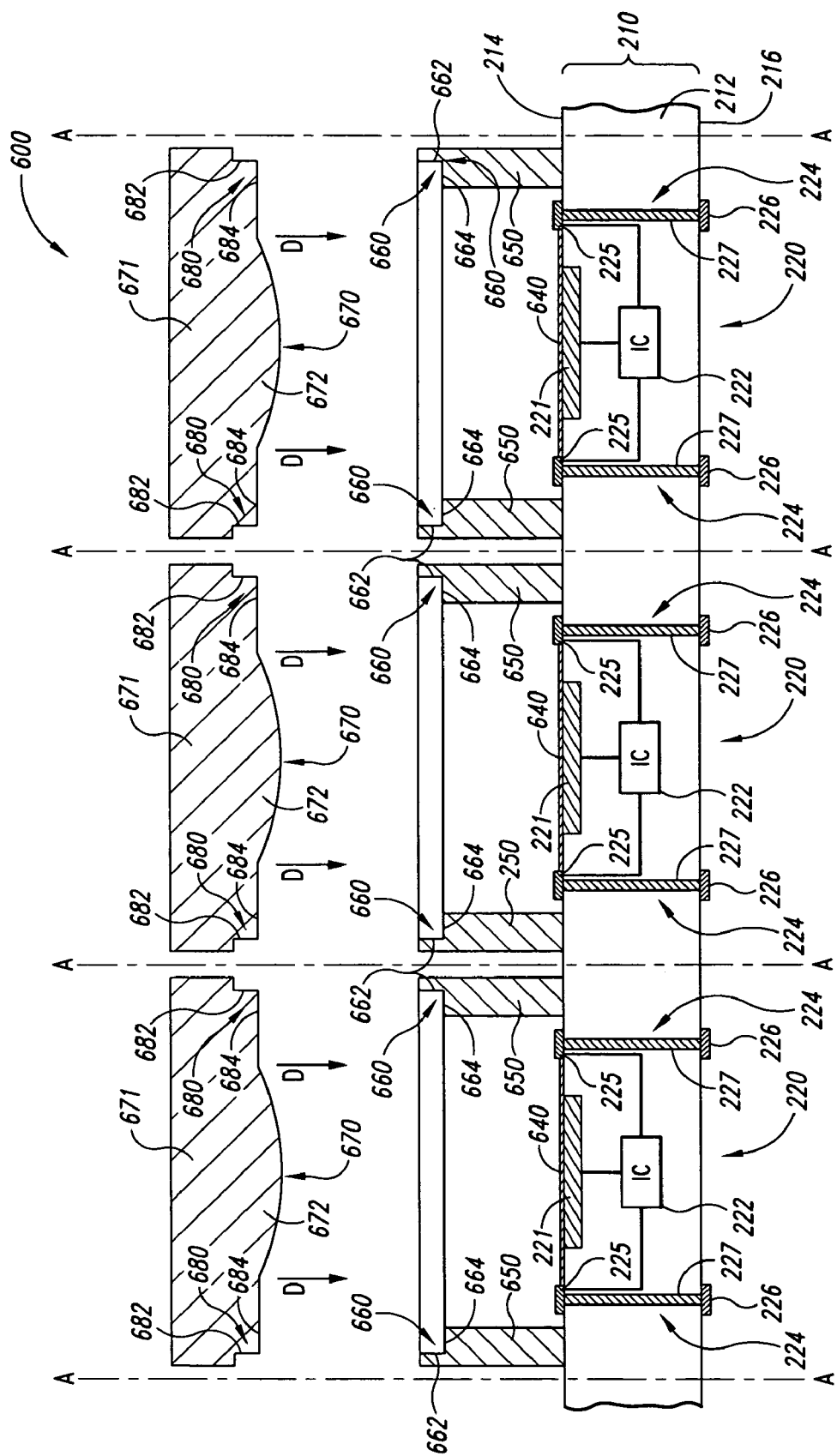

After the optics supports 650 have been formed, optical devices 670 are mounted to corresponding optics supports 650, as shown in FIG. 6D. The optical devices 670 of the embodiment shown in FIG. 6D have been singulated to separate the individual optical devices 670 from each other before being mounted to the optics supports 650. The individual optical devices 670 are each single unitary components in which the second substrate 671, optics element 672, and second interface feature 680 are integral pieces of the same material. The second substrates 671 are transmissive to a desired spectrum of radiation and can be formed of materials generally similar to those of the second substrate 371 described above with respect to FIG. 3A. The optics elements 672 are configured to manipulate the radiation for use by the image sensors 221 and can be generally similar to the optics elements 371 described above in FIG. 3A. The second interface features 680 include second alignment components 682 and second stop components 684. The second interface features 680 are configured to mate or otherwise interface with the first interface features 660 of the optics support 650 to position the optics elements 672 at a desired location relative to corresponding image sensors 221.

Figure 6E:
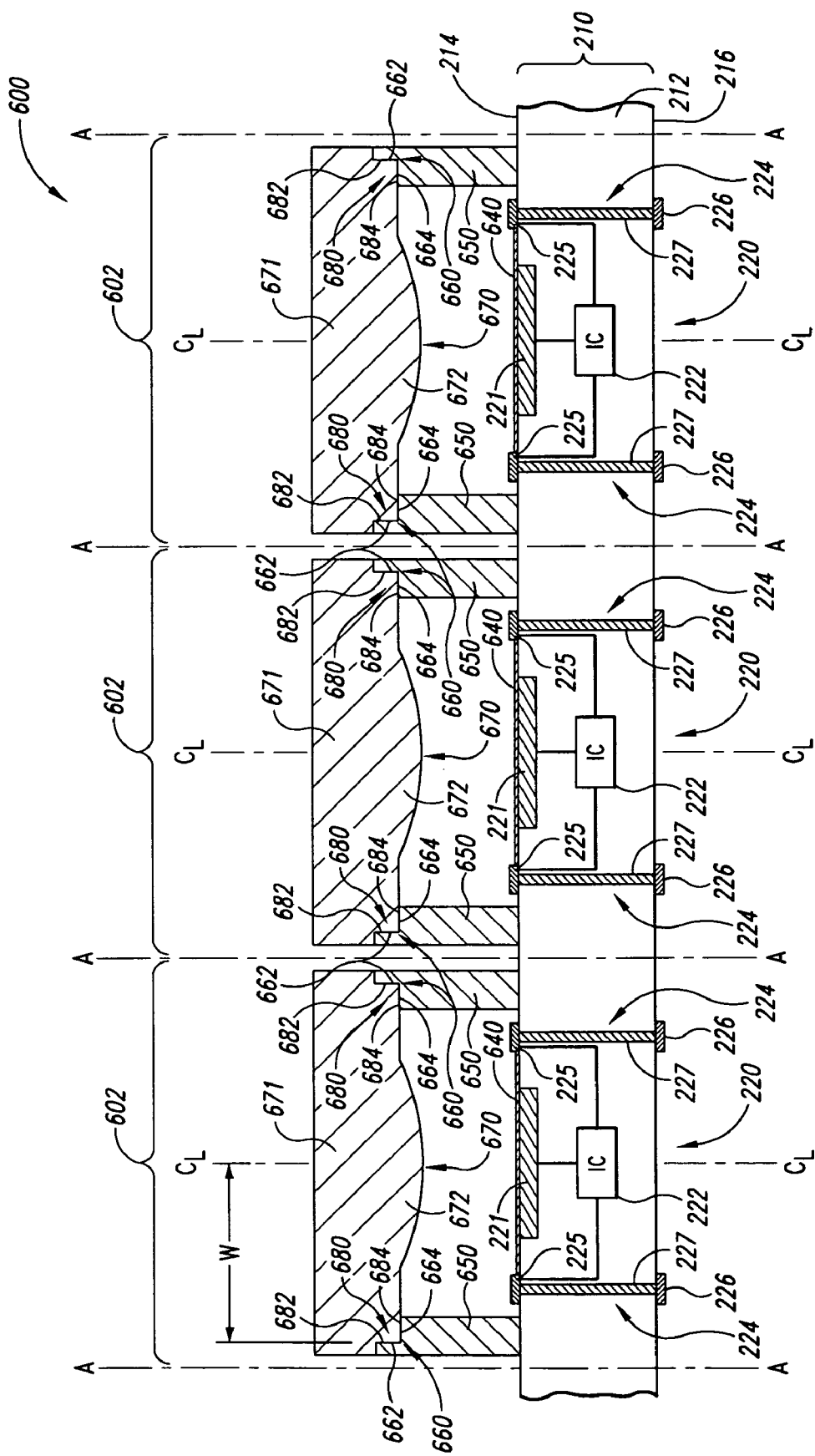

Automatic handling equipment can place the individual optical devices 670 (as shown by arrows D) on corresponding optics supports 650. More specifically, individual first interface features 660 of the optics supports 650 can receive the corresponding second interface features 680 of one of the optical devices 670 such that the optics element 672 of each optical device 670 is at a desired position with respect to a corresponding image sensor 221. Referring to FIG. 6E, the optical devices 670 can be secured to the optics supports 650 with a UV curing adhesive as described above. In other embodiments, the optical devices 670 may be secured to the optics supports 650 using other materials and/or methods. After securing the optical devices 670 to corresponding optics supports 650, the workpiece 210 can be cut along lines A-A to singulate the imagers 602.

The embodiment of the assembly 600 shown in FIG. 6E is fabricated at the wafer level such that several imagers 602 are packaged before singulating the first substrate 212 to separate the individual image sensors 602 from each other. One aspect of wafer-level packaging is using automated handling equipment to install the optical devices 670 such that the optics elements 672 are aligned with and spaced apart from the corresponding image sensors 221 by a desired focal distance. This is achieved, in part, by constructing the optics supports 650 using fast, accurate processes and incorporating the optical devices 670 as single unitary components.

The optics supports 650 fabricated as shown in FIGS. 6A-6E have precise dimensions to accurately position the optical devices 670 with respect to corresponding image sensors 221. For example, the upper surface 632 of the support material layer 630 is generally formed at a precise distance from the imager sensors 221 across the entire imager workpiece 210 because chemical-mechanical planarization and certain deposition processes are capable of forming highly planar surfaces at exact endpoints across a wafer. Additionally, the first and second etches shown in FIGS. 6B and 6C can accurately form the alignment components 662 and the stop components 664 with respect to corresponding image sensors 221 with a high degree of precision. Therefore, the first interface features 660 have precise dimensions that are located relative to the image sensors to position the optical devices 670 within very tight tolerances. This allows automated handling equipment to attach the optical devices 670 to the imaging units 210 at the wafer level without manually adjusting the focal distance.

The embodiment of the method illustrated in FIGS. 6A-6E is also efficient in that it has a relatively high throughput and uses existing equipment and processes in a semiconductor fabrication facility. The deposition, chemical-mechanical planarization, and etching procedures are established processes that are used to manufacture semiconductor devices having feature sizes of 0.11 µm or less. As a result, the optics supports 650 can be formed in a process flow for manufacturing semiconductor devices.

A further advantage of the method illustrated in FIGS. 6A-6E is that the imagers 602 can be tested from the back side 216 of the first substrate 212. A test probe can contact the back side 216 of the dies 220 to test the individual imagers 602 because the through-wafer interconnects 227 provide back side electrical contacts 226 (e.g., ball-pads). Accordingly, because the test probe engages contacts 226 on the back side 216 of the first substrate 212, it will not damage the image sensors 221 or associated circuitry on the front side 214 of the first substrate 212. It is advantageous to test the imagers 602 in an environment where the image sensors 221 will not be damaged during testing. Furthermore, the optical devices 670 can be attached only to known good imaging dies 220, thus improving the overall yield and reducing cost.

Figure 7:
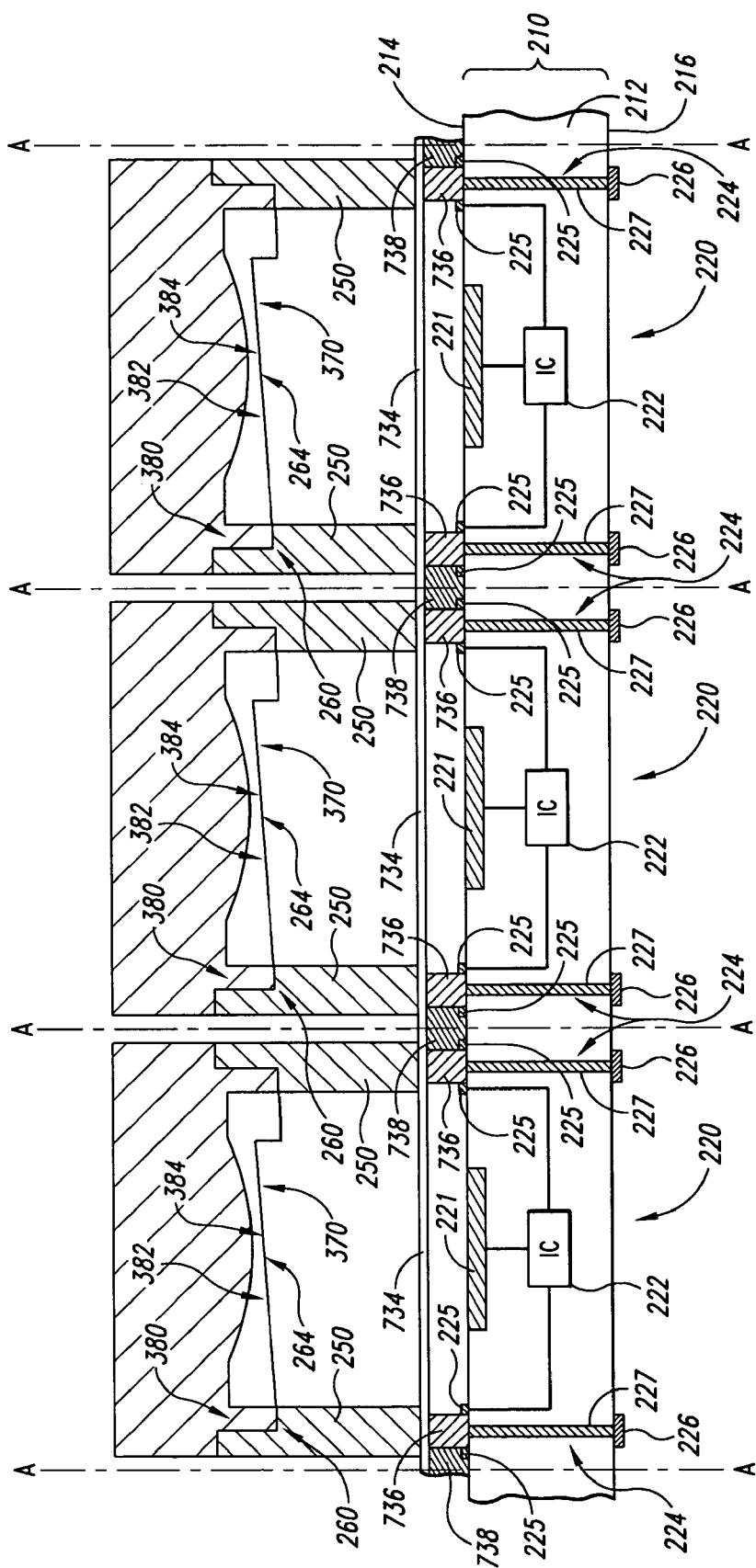
FIG. 7 is a side cross-sectional view illustrating installed optical devices in accordance with another embodiment of the invention.

FIG. 7 illustrates another method for constructing optics supports 250 (FIG. 3D) on the imager workpiece 210 in accordance with another embodiment of the invention. In this embodiment, the optics supports 250 are constructed on a cover 734 over the workpiece 210, rather than being seated directly on the first substrate 212. The imaging dies 220 can include spacers 736 projecting from the front side 214 of the first substrate 212. The spacers 736 can be dielectric elements deposited onto the first substrate 212 or manufactured separately from the first substrate and adhered to the front side 214. Alternatively, the spacers 736 can be conductive elements that project upwardly from the interconnects 227, such as those formed according to the processes described in U.S. patent application Ser. No. 10/867,352, entitled "Microelectronic Imagers and Methods of Packaging Microelectronic Imagers," filed on Jun. 14, 2004 (Perkins Coie Docket No. 108298753US00), which is incorporated by reference herein in its entirety.

The imaging workpiece 210 further includes a sealant 738 around an outer perimeter portion of the spacers 736 and the cover 734 attached to the spacers. The cover 734 can be glass, quartz, or another suitable material that is transmissive to the desired spectrum of radiation. The cover 734, for example, can further include one or more anti-reflective films and/or filters. Additionally, the cover 734 can be a single pane covering a plurality of the dies 220 as shown in FIG. 7, or the cover 734 can have individual panes over each die 220. The optics supports 250 can be formed on the cover 734 according to the processes described above with respect to FIGS. 2A-2C, and optical devices 270 can be attached as described above in FIG. 3A-3D.

Figure 8:
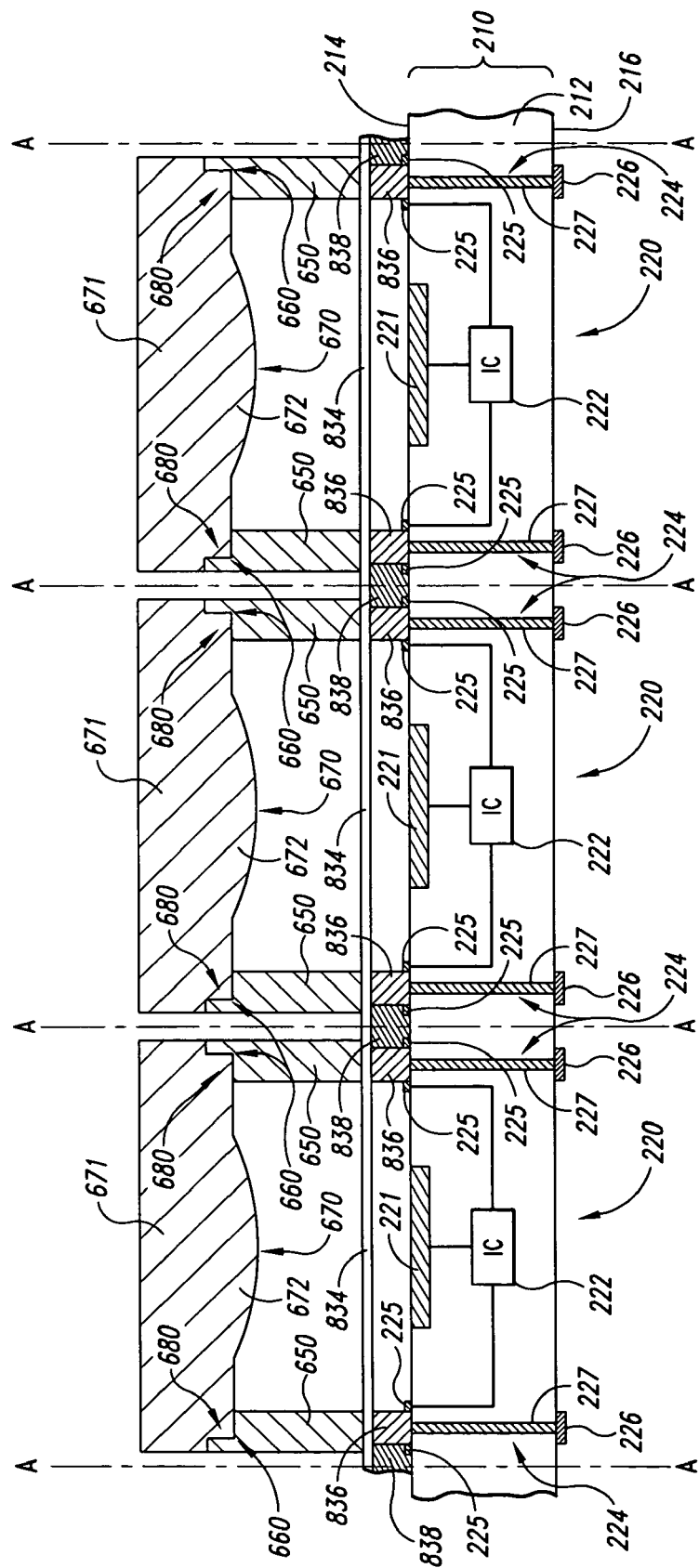
FIG. 8 is a side cross-sectional view illustrating installed optical devices in accordance with another embodiment of the invention.

FIG. 8 illustrates another method for constructing optics supports on the imager workpiece 210 in accordance with yet another embodiment of the invention. In this embodiment, the optics supports 650 as described above with respect to FIGS. 6A-6E are constructed on a cover 834 over the workpiece 210, rather than being seated directly on the first substrate 212. The imaging dies 220 can include spacers 836 projecting from the front side 214 of the first substrate 212, sealant 838 around an outer perimeter portion of the spacers 836, and a cover 834 attached to the spacers 836. The spacers 836, sealant 838, and cover 834 can be generally similar to the spacers 736, sealant 738, and cover 734 described above with respect to FIG. 7.

Figure 9:
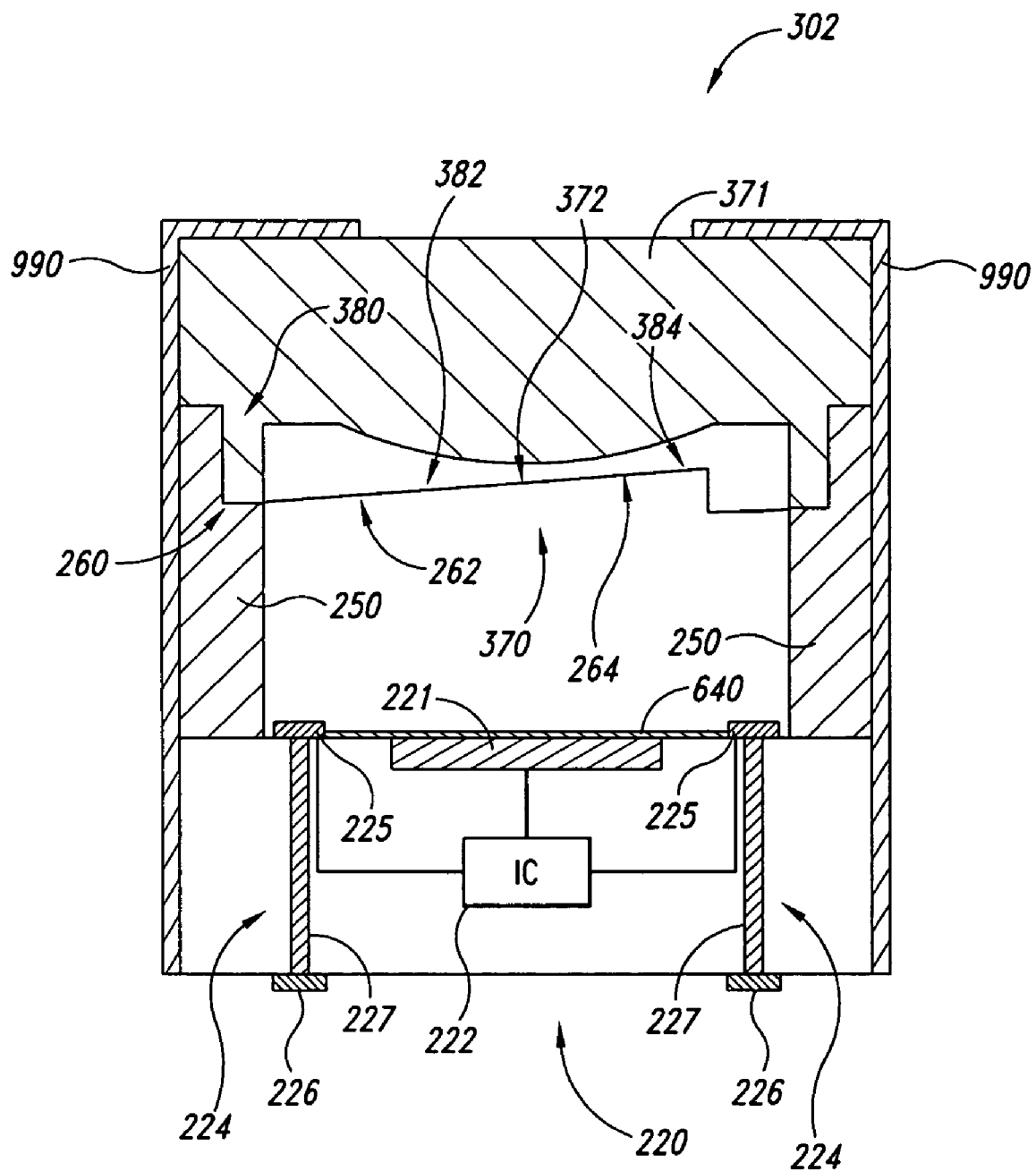
FIG. 9 is a cross-sectional view illustrating a microelectronic imager of FIG. 3D after singulation in accordance with an embodiment of the invention.

FIG. 9 is a side cross-sectional view of a microelectronic imager 302 after the assembly 300 of FIG. 3D has been cut along lines A-A to singulate the individual imagers 302. The microelectronic imager 302 shown in FIG. 9 has the rotationally adjustable first and second interface features 260 and 280 and the filtering layer 640. After singulation, an encapsulation material 990 can be applied to the imager 302. In the illustrated embodiment, the encapsulation material 990 is applied to an outer surface of the optical device 370 and portions of the die 220. In other embodiments, the encapsulation material 990 may be applied to different portions of the imager 302. The encapsulation material 990 is an opaque material that blocks radiation from entering through the side of the imager 302. In addition, the encapsulation material 990 further seals the package and provides additional structural support for protecting the imager 302 and its components. In other embodiments, the encapsulation material 990 may be applied to singulated imagers formed in accordance with any of the methods described above with respect to FIGS. 2A-8.

From the foregoing, it will be appreciated that specific embodiments of the invention have been described herein for purposes of illustration, but that various modifications may be made without deviating from the spirit and scope of the invention. For example, various aspects of any of the foregoing embodiments can be combined in different combinations. Accordingly, the invention is not limited except as by the appended claims.

We claim:

1. A method of manufacturing microelectronic imagers on an imager workpiece including a plurality of imaging dies on and/or in a substrate, the individual imaging dies having image sensors, integrated circuitry operatively coupled to the image sensors, and external contacts electrically coupled to the integrated circuitry, the method comprising:

fixedly positioning optics supports at the imager workpiece before cutting the workpiece to singulate the individual imaging dies, the optics supports having openings aligned with corresponding image sensors and first interface features at reference locations relative to corresponding image sensors;

attaching optical devices to optics supports, wherein the optical devices include second interface features, and wherein the first interface features are mated with second interface features to position the optics elements at a desired location relative to corresponding image sensors; and adjusting the distance between the optical devices and corresponding image sensors by rotating individual optical devices with respect to corresponding optics supports.

2. The method of claim 1 wherein:

fixedly positioning optics supports at the imager workpiece comprises depositing a layer of support material onto the substrate and etching the openings and first interface features into the layer of support material, and wherein the first interface features include at least one first alignment component and at least one first adjustable stop component; and attaching optical devices to optics supports comprises molding optical devices with integral second interface features having at least one second alignment component and at least one second adjustable stop component configured to mate with the first alignment component and first adjustable stop component before adjusting the distance between the optical devices and corresponding image sensors.

3. The method of claim 1 wherein:

fixedly positioning optics supports at the imager workpiece comprises depositing a layer of support material onto the substrate and etching the openings and first interface features into the layer of support material, and wherein the individual first interface features include one or more inclined steps arranged about an adjustment axis, the individual steps having a ramp segment with an inclined surface curved about the adjustment axis and positioned at an inner diameter of the optics support;

attaching optical devices to optics supports comprises molding optical devices with integral second interface features having one or more complementary inclined steps configured to mate with the one or more inclined steps of the first interface features before adjusting the distance between the optical devices and corresponding image sensors; and adjusting the distance between the optical devices and corresponding image sensors comprises rotatably adjusting at least one of the first and second interface features relative to each other after mating the first inclined steps with corresponding second inclined steps to position the optics elements at a desired location along the adjustment axis relative to corresponding image sensors.

4. The method of claim 1 wherein:

fixedly positioning optics supports at the imager workpiece comprises depositing a layer of support material onto the substrate and etching the openings and first interface features into the layer of support material, and wherein the first interface features include a plurality of inclined first ramp segments arranged about an adjustment axis, the individual first ramp segments including inclined surfaces curved about the adjustment axis and risers;

attaching optical devices to optics supports comprises molding optical devices with integral complementary inclined second ramp segments arranged about the adjustment axis, the individual second ramp segments including inclined surfaces curved about the adjustment axis and risers, and wherein the second ramp segments are configured to mate with the first ramp segments before adjusting the distance between the optical devices and corresponding image sensors; and adjusting the distance between the optical devices and corresponding image sensors comprises rotatably adjusting at least one of the first and second interface features relative to each other after mating the first ramp segments with corresponding second ramp segments to position the optics elements at a desired location along the adjustment axis relative to corresponding image sensors.

5. The method of claim 1 wherein adjusting the distance between the optical devices and corresponding image sensors comprises rotatably adjusting the optical devices and corresponding optics supports relative to each other in a clockwise and/or counterclockwise direction after seating the first and second interface features together to position the optics elements at a desired location relative to corresponding image sensors.

6. The method of claim 1 wherein the first interface feature has a male configuration and the second interface feature has a female configuration, and wherein:

attaching optical devices to optics supports comprises mating the first interface features with corresponding second interface features such that the first interface features are received within corresponding second interface features.

7. The method of claim 1 wherein the first interface feature has a female configuration and the second interface feature has a male configuration, and wherein:

attaching optical devices to optics supports comprises mating the first interface features with corresponding second interface features such that the first interface features receive corresponding second interface features.

8. The method of claim 1 wherein attaching optical devices to optics supports comprises mounting a discrete optical device to an individual optics support at a corresponding one of the individual imaging dies.

9. The method of claim 1, further comprising applying a filtering layer on the image sensors and/or the optical devices, the filtering layer including an anti-reflective film and/or an infrared blocking film.

10. The method of claim 1, further comprising applying a filtering layer directly on the image sensors before fixedly positioning optics supports at the imager workpiece, the filtering layer including an anti-reflective film and/or an infrared blocking film.

11. The method of claim 1 wherein fixedly positioning optics supports at the imager workpiece comprises depositing a layer of support material onto the workpiece and etching the openings and first interface features into the layer of support material.

12. The method of claim 1 wherein fixedly positioning optics supports at the imager workpiece comprises (a) forming spacers having apertures in alignment with the image sensors on the front side of the workpiece, (b) attaching a cover to the spacers, and (c) depositing a layer of support material onto the cover and etching the openings and first interface features into the layer of support material.

13. The method of claim 1 wherein fixedly positioning optics supports at the imager workpiece comprises (a) depositing a layer of support material onto a second substrate, (b) etching the openings and first interface features into the layer of support material such that the support layer has footings, and (c) attaching the footings to a front side of the imager workpiece.

14. The method of claim 1 wherein attaching optical devices to optics supports and rotating individual optical devices with respect to corresponding optics supports comprises moving at least one of the optical devices and optics supports using automated equipment.

15. A method of manufacturing microelectronic imagers, comprising:

providing an imager workpiece having a plurality of imaging dies including image sensors and external contacts electrically coupled to the image sensors;

positioning optics supports relative to the imager workpiece before cutting the imager workpiece, the optics supports having openings aligned with corresponding image sensors and first interface features at reference locations relative to corresponding image sensors, wherein the first interface features comprise at least one first inclined step; and attaching optical devices to optics supports, the optical devices having second interface features comprising at least one second inclined step, and wherein the optical devices are attached to the optics supports by seating a first inclined step with corresponding second inclined step to position the optics elements at a desired location relative to corresponding image sensors.

16. The method of claim 15 wherein the first and second inclined steps comprise inclined first and second ramp segments, respectively, the individual first and second ramp segments including inclined surfaces curved about an axis and risers, and wherein:

positioning optics supports relative to the imager workpiece comprises depositing a layer of support material onto the workpiece and etching the openings and first ramp segments into the layer of support material; and attaching optical devices to optics supports comprises seating complementary second ramp segments of the optical devices with corresponding first ramp segments to position the optics elements at a desired location along the adjustment axis relative to corresponding image sensors.

17. The method of claim 15 wherein the first and second inclined steps comprise a plurality of inclined first and second ramp segments, respectively, the individual first and second ramp segments including inclined surfaces curved about an axis and risers, and wherein:
positioning optics supports relative to the imager workpiece comprises depositing a layer of support material onto the workpiece and etching the openings and first ramp segments into the layer of support material; and
attaching optical devices to optics supports comprises seating complementary second ramp segments of the optical devices with corresponding first ramp segments to position the optics elements at a desired location along the adjustment axis relative to corresponding image sensors.

18. The method of claim 15, further comprising applying a filtering layer on the image sensors and/or the optical devices, the filtering layer including an anti-reflective film and/or an infrared blocking film.

19. The method of claim 15, further comprising applying a filtering layer directly on the image sensors before positioning optics supports relative to the imager workpiece, the filtering layer including an anti-reflective film and/or an infrared blocking film.

20. The method of claim 15 wherein attaching optical devices to optics supports comprises mounting a discrete optical device to an individual optics support at a corresponding one of the individual imaging dies.

21. The method of claim 15 wherein:
providing the workpiece comprises fabricating the image sensors on a front side of a substrate; and
positioning optics supports relative to the imager workpiece comprises depositing a layer of support material onto the substrate and etching the openings and first interface features into the layer of support material.

22. The method of claim 15 wherein:
providing the imager workpiece comprises (a) fabricating the image sensors on a front side of a substrate, (b) forming spacers having apertures in alignment with the image sensors on the front side of the substrate, and (c) attaching a cover to the spacers; and
positioning optics supports relative to the imager workpiece comprises depositing a layer of support material onto the cover and etching the openings and first interface features into the layer of support material.

23. The method of claim 15 wherein:
providing the imager workpiece comprises (a) fabricating the image sensors on a front side of a substrate, (b) forming the external contacts on a back side of the substrate, and (c) forming through-wafer interconnects electrically coupling the external contacts to corresponding image sensors;
positioning optics supports relative to the imager workpiece comprises depositing a layer of support material onto the substrate and etching the openings and first interface features into the layer of support material; and
attaching optical devices to optics supports comprises attaching optical devices formed from glass, quartz, plastics, and/or other materials that can be molded into the desired shape and provide the desired transmission properties for the radiation directed to the image sensors.

24. The method of claim 15, further comprising rotatably adjusting individual optical devices relative to corresponding optics supports in a clockwise and/or counterclockwise direction after seating the first and second inclined steps together to position the optics elements at a desired location relative to corresponding image sensors.

25. The method of claim 15, further comprising rotatably adjusting the optical devices and corresponding optics supports relative to each other in a clockwise and/or counter-clockwise direction after seating the first and second inclined steps together to position the optics elements at a desired location relative to corresponding image sensors.

26. The method of claim 15, further comprising applying a filtering layer on the image sensors, and wherein:
positioning optics supports relative to the imager workpiece comprises
(a) depositing a layer of support material onto a second substrate,
(b) etching the openings and first interface features into the layer of support material such that the support layer has footings, and
(c) attaching the footings to a front side of the imager workpiece.

27. The method of claim 15 wherein:
providing the workpiece comprises (a) fabricating the image sensors on a front side of a first substrate, (b) forming spacers having apertures in alignment with the image sensors on the front side of the first substrate, and (c) attaching a cover to the spacers; and
positioning optics supports relative to the imager workpiece comprises (a) depositing a layer of support material onto a second substrate, (b) etching the openings and first interface features into the layer of support material such that the support layer has footings, and (c) attaching the footings to the cover.

28. The method of claim 15 wherein attaching optical devices to optics support comprises attaching optical devices with integral focus lenses, dispersion lenses, pin-hole lenses, filters, and/or anti-reflective mediums in alignment with individual image sensors.

29. The method of claim 15 wherein attaching optical devices to optics supports comprises moving at least one of the optical devices and optics supports using automated equipment.

30. A method of manufacturing microelectronic imagers, comprising:
fabricating a plurality of imaging dies on and/or in a workpiece having a substrate, the imaging dies comprising image sensors at a front side of the substrate, integrated circuitry operatively coupled to the image sensors, and external contacts electrically coupled to the integrated circuitry;
positioning optics supports with respect to the substrate so that the individual optics supports have an opening aligned with a corresponding image sensor and a first interface feature at a reference location relative to the corresponding image sensor, wherein individual first interface features include a first ramp segment having an inclined surface curved about an adjustment axis and a riser;
providing optical devices having integral optics elements and second interface features, wherein the optical devices are single unitary components and individual second interface features include a second ramp segment having an inclined surface curved about the adjustment axis and a riser; and
attaching optical devices to optics supports by seating the first ramp segments with corresponding second ramp segments to position the optics elements at a desired location along the adjustment axis relative to corresponding image sensors.

31. The method of claim 30, further comprising rotatably adjusting at least one of the first and second interface features relative to each other after seating the first ramp segment with corresponding second ramp segment to position the optics elements at a desired location along the adjustment axis relative to corresponding image sensors.

32. The method of claim 30, further comprising rotatably adjusting at least one of the optics support and optical devices relative to each other in a clockwise and/or counterclockwise direction after seating the first ramp segment with corresponding second ramp segment to position the optics elements at a desired location along the adjustment axis relative to corresponding image sensors.

33. The method of claim 30 wherein the first interface features have a male configuration and the second interface features have a female configuration, and wherein:
   attaching optical devices to optics supports comprises mating the first interface features with corresponding second interface features such that the first interface features are received within corresponding second interface features.

34. The method of claim 30 wherein the first interface features have a female configuration and the second interface features have a male configuration, and wherein:
   attaching optical devices to optics supports comprises mating the first interface features with corresponding second interface features such that the first interface features receive corresponding second interface features.

35. The method of claim 30 wherein:
   fabricating the plurality of imaging dies comprises (a) forming the external contacts on a back side of the substrate, and (b) forming through-wafer interconnects electrically coupling the external contacts to corresponding image sensors;
   positioning optics supports with respect to the substrate comprises depositing a layer of support material onto the substrate and etching the openings and first interface features into the layer of support material; and
   providing the optical devices comprises molding glass, quartz, plastics, and/or other materials that can be molded into the desired shape and provide the desired transmission properties for the radiation directed to the image sensors.

36. The method of claim 30 wherein attaching optical devices to optics supports comprises mounting a discrete optical device to an individual optics support at a corresponding one of the individual imaging dies.

37. The method of claim 30 wherein providing the optical devices with integral optics elements comprises forming optical devices with integral focus lenses, dispersion lenses, pinhole lenses, filters, and/or anti-reflective mediums in alignment with individual image sensors.

38. The method of claim 30 wherein attaching optical devices to optics supports comprises moving at least one of the optical devices and optics supports using automated equipment.

39. A method of manufacturing microelectronic imagers, comprising:
   fabricating a plurality of imaging dies on and/or in a workpiece having a substrate, the imaging dies comprising image sensors at a front side of the substrate, integrated circuitry operatively coupled to the image sensors, and external contacts electrically coupled to the integrated circuitry;
   positioning optics supports relative to the substrate, wherein individual optics supports have an opening aligned with a corresponding image sensor, a first alignment component at a reference location relative to the corresponding image sensor, and a first stop component;
   providing optical devices having optics elements a second alignment component, and second stop component, and wherein the optical devices are single unitary components in which the optics elements, second alignment component, and second stop component are integral features formed of a single material; and
   attaching optical devices to optics supports by mating the first alignment component and first stop component with the second alignment component and second stop component to position the optics elements at a desired location relative to corresponding image sensors.

40. The method of claim 39 wherein:
positioning optics supports relative to the substrate comprises depositing a layer of support material onto the substrate and etching the openings, first alignment component, and first stop component into the layer of support material; and
attaching optical devices to optics supports comprises mating first alignment component and first stop component with the second alignment component and second stop component in a fixed non-adjustable position at a desired location relative to corresponding image sensors.

41. The method of claim 39 wherein:
positioning optics supports relative to the substrate comprises depositing a layer of support material onto the substrate and etching the openings, first alignment component, and first stop component into the layer of support material, and wherein the first stop component includes one or more first inclined steps arranged about an adjustment axis, the individual first steps having a ramp segment with an inclined surface curved about the adjustment axis and positioned at an inner diameter of the optics support;
providing optical devices having optics elements comprises providing the second stop component having one or more complementary second inclined steps, the individual second inclined steps having a ramp segment with an inclined surface curved about the adjustment axis and positioned at an inner diameter of the optical device, and wherein the one or more second inclined steps are configured to mate with the one or more first inclined steps of the first interface features; and wherein the method further comprises
adjusting the distance between the optical devices and corresponding image sensors by rotatably adjusting at least one of the first and second interface features relative to each other after mating the first inclined steps with corresponding second inclined steps to position the optics elements at a desired location along the adjustment axis relative to corresponding image sensors.

42. A method of manufacturing microelectronic imagers on an imager workpiece including a plurality of imaging dies on and/or in a substrate, the individual imaging dies having image sensors, integrated circuitry operatively coupled to the image sensors, and external contacts electrically coupled to the integrated circuitry, the method comprising:
   engaging a plurality of first ramp segments at a common first elevation along a first interface feature of an optics support fixed to an individual imaging die with a corresponding plurality of second ramp segments at a common second elevation along a first interface feature fixed to an individual optical device having an optics element; and rotating the first and second interface features with respect to each other to move the optics element to a desired location along a z-axis relative to the corresponding image sensor.

43. A method of manufacturing microelectronic imagers on an imager workpiece including a plurality of imaging dies on and/or in a substrate, the individual imaging dies having image sensors, integrated circuitry operatively coupled to the image sensors, and external contacts electrically coupled to the integrated circuitry, the method comprising:

sliding first members having inner walls projecting away from the imager workpiece axially along an adjustment axis into second members until first interface features of the first members contact corresponding second interface features of the second members, the individual first interface features having a first ramp segment projecting inwardly normal to the inner wall and inclined relative to the adjustment axis and the individual second interface features having a complementary second ramp segment projecting inwardly normal to the inner wall of the first members and inclined relative to adjustment axis; and rotatably adjusting at least one of the first and second members less than 360 degrees to position optics elements at a desired location along the adjustment axis relative to the corresponding image sensors.

44. The method of claim 43 wherein sliding the first members along the adjustment axis into second members comprises sliding the first members along the adjustment axis without rotating the first members before the first interface features contact corresponding second interface features.

* * * * *

UNITED STATES PATENT AND TRADEMARK OFFICE
CERTIFICATE OF CORRECTION

PATENT NO. : 7,429,494 B2 Page 1 of 1
APPLICATION NO. : 10/925406
DATED : September 30, 2008
INVENTOR(S) : Oliver et al.

It is certified that error appears in the above-identified patent and that said Letters Patent is hereby corrected as shown below:

In column 16, line 54, in Claim 15, after "with" insert -- a --.

In column 20, line 6, in Claim 39, after "elements" insert -- , --.

Signed and Sealed this

Twenty-fifth Day of November, 2008

JON W. DUDAS
*Director of the United States Patent and Trademark Office*